(12) United States Patent
Zhang et al.

(10) Patent No.: US 8,767,355 B2
(45) Date of Patent: Jul. 1, 2014

(54) PIEZOELECTRIC ACTUATOR, HEAD GIMBAL ASSEMBLY INCLUDING THE SAME AND METHOD OF FORMING THE SAME

(71) Applicant: Agency for Science, Technology and Research, Singapore (SG)

(72) Inventors: Lei Zhang, Singapore (SG); Kui Yao, Singapore (SG); Charanjit Singh Bhatia, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/746,961

(22) Filed: Jan. 22, 2013

(65) Prior Publication Data

US 2013/0188282 A1 Jul. 25, 2013

(30) Foreign Application Priority Data

Jan. 19, 2012 (SG) .................................. 201200432

(51) Int. Cl.
*G11B 5/58* (2006.01)
(52) U.S. Cl.
USPC ........................................................ 360/294.4
(58) Field of Classification Search
CPC .............. G11B 5/58; G11B 5/55; G11B 5/48; G11B 21/16
USPC ............ 360/294.4, 294.3, 294.7, 294, 294.1, 360/294.2, 294.5, 294.6, 245.8, 245.9
See application file for complete search history.

(56) References Cited

U.S. PATENT DOCUMENTS

| | | | |
|---|---|---|---|
| 6,570,730 B1 * | 5/2003 | Lewis et al. ...................... | 360/75 |
| 7,940,490 B2 * | 5/2011 | Shelor ......................... | 360/78.05 |
| 8,125,741 B2 * | 2/2012 | Shelor ......................... | 360/294.4 |
| 2004/0061969 A1 * | 4/2004 | Yang et al. .................. | 360/78.05 |
| 2008/0297949 A1 * | 12/2008 | Naniwa et al. ............. | 360/294.4 |
| 2009/0021857 A1 * | 1/2009 | Shelor ......................... | 360/77.16 |
| 2009/0268326 A1 * | 10/2009 | Shelor ............................ | 360/31 |

* cited by examiner

*Primary Examiner* — Allen T Cao
(74) *Attorney, Agent, or Firm* — Wolf, Greenfield & Sacks, P.C.

(57) ABSTRACT

According to embodiments of the present invention, a piezoelectric actuator is provided. The piezoelectric actuator includes a shear mode piezoelectric material including a first arm and a second arm intersecting each other, the shear mode piezoelectric material having a polarization direction oriented at least substantially along a length of the first arm, wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

24 Claims, 18 Drawing Sheets

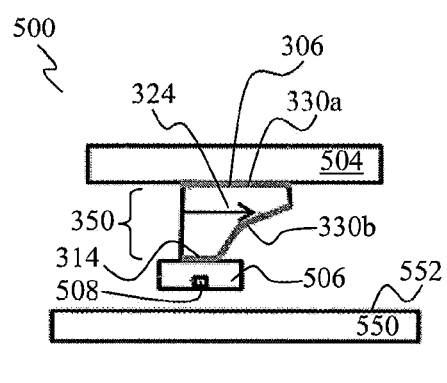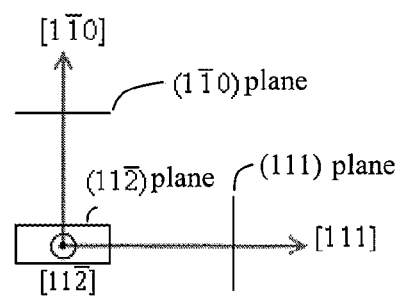
FIG. 5C
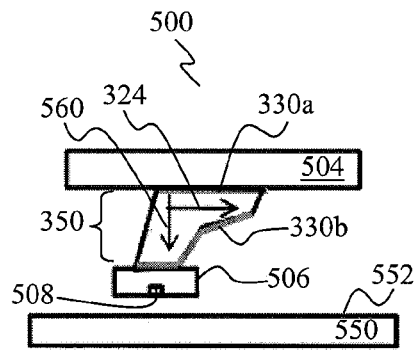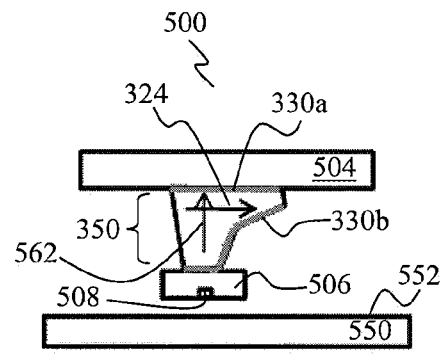
FIG. 5D　　　　　　　　　　　FIG. 5E

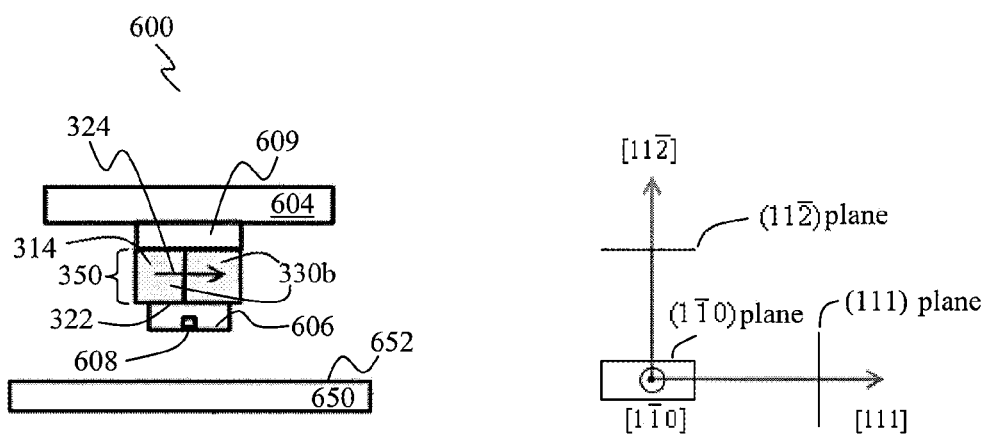
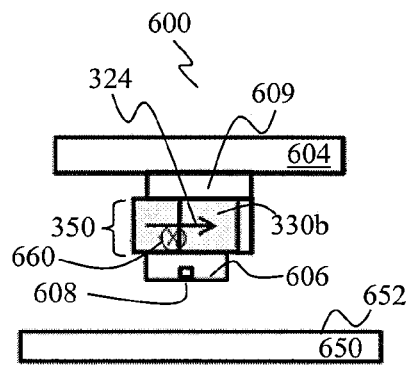
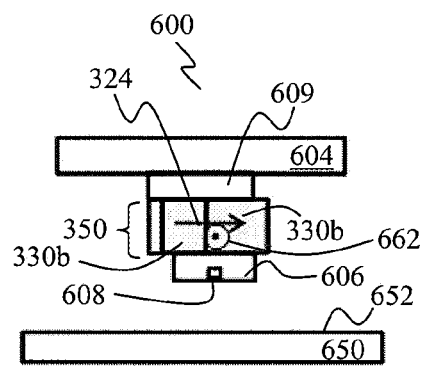
FIG. 6C
FIG. 6D FIG. 6E

PIEZOELECTRIC ACTUATOR, HEAD GIMBAL ASSEMBLY INCLUDING THE SAME AND METHOD OF FORMING THE SAME

CROSS-REFERENCE TO RELATED APPLICATION

This application claims the benefit of priority of Singapore patent application No. 201200432-1, filed 19 Jan. 2012, the content of it being hereby incorporated by reference in its entirety for all purposes.

TECHNICAL FIELD

Various embodiments relate to a piezoelectric actuator, a head gimbal assembly including a piezoelectric actuator and a method of forming a piezoelectric actuator.

BACKGROUND

With strong demand for larger data storage capacity in computers, data areal density in hard disk drive has increased significantly by about 30-40% per year. With the increase in data areal density, the intervals between data tracks are becoming narrower and narrower. The narrower data tracks make it difficult for hard drive motors to quickly and precisely position the read/write head over the desired tracks for data storage. Typical hard drive actuators such as voice coil motors (VCM) usually cannot meet the resolution and bandwidth requirements of high track density hard disk drives.

Great efforts have been made to increase the resolution and bandwidth by incorporating a second-stage actuator on the load beam of a head gimbal assembly or between the slider and the load beam. However, there are still difficulties in meeting the higher displacement resolution and broader bandwidth requirements of high track density hard disk drives (up to 1 to 10 TBit/in$^2$).

For a second-stage actuator which is placed on the load beam, the displacement resolution and resonant frequency are not high enough for high track density hard drives, although it has a better performance than that without second-stage actuators.

For a second-stage actuator which is placed between the slider and the load beam, the fabrication process is usually complicated. For some types of micro-actuators, the precision of actuator dimensions may affect the displacement performance of the actuators, which makes it demanding for quality control during manufacturing. When the second stage actuator is a piezoelectric ceramic micro-actuator in shear mode, the resulting shear displacement under a typical 12 V working voltage cannot provide large enough displacement to drive the read/write head. Piezoelectric multilayer ceramic actuator in shear mode can provide larger displacements but the complicated structure significantly compromises the reliability of the actuator and increases the cost.

SUMMARY

According to an embodiment, a piezoelectric actuator is provided. The piezoelectric actuator may include a shear mode piezoelectric material including a first arm and a second arm intersecting each other, the shear mode piezoelectric material having a polarization direction oriented at least substantially along a length of the first arm, wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

According to an embodiment, a method of forming a piezoelectric actuator is provided. The method may include poling a shear mode piezoelectric material to provide a polarization direction, and forming the shear mode piezoelectric material into a first arm and a second arm intersecting each other, wherein the polarization direction is oriented at least substantially along a length of the first arm, and wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

According to an embodiment, a head gimbal assembly for a disk drive is provided. The head gimbal assembly may include a load beam including a tongue portion at an end thereof, a slider including a read/write head, and a shear mode piezoelectric material coupled between the tongue portion and the slider, wherein the shear mode piezoelectric material includes a first arm and a second arm intersecting each other, wherein the shear mode piezoelectric material has a polarization direction oriented at least substantially along a length of the first arm, and wherein the shear mode piezoelectric material has a first surface and a second surface opposite to the first surface, the first surface and the second surface being adapted to undergo a shear displacement relative to each other for displacing the read/write head along an axis at least substantially parallel to the polarization direction in response to an electric field applied between the first surface and the second surface in a direction at least substantially perpendicular to the polarization direction.

According to an embodiment, a head gimbal assembly for a disk drive is provided. The head gimbal assembly may include a load beam comprising a tongue portion at an end thereof, the load beam defining a longitudinal axis, a slider including a read/write head, and a shear mode piezoelectric single crystal material coupled between the tongue portion and the slider, wherein the shear mode piezoelectric single crystal material has a polarization direction oriented at least substantially perpendicular to the longitudinal axis, wherein the shear mode piezoelectric single crystal material has a first surface and a second surface opposite to the first surface, the first surface and the second surface being adapted to undergo a shear displacement relative to each other for displacing the read/write head along an axis at least substantially parallel to the polarization direction in response to an electric field applied between the first surface and the second surface in a direction at least substantially perpendicular to the polarization direction, wherein the first surface and the second surface are arranged at least substantially parallel to a ($1\bar{1}0$) plane or a ($11\bar{2}$) plane of the shear mode piezoelectric single crystal material, wherein the polarization direction is at least substantially perpendicular to a (111) plane of the shear mode piezoelectric single crystal material, and wherein the first surface is coupled to the tongue portion.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIGS. 5C to 5E show the working principle of the head gimbal assembly of the embodiment of FIG. 5A.

FIGS. 6C to 6E show the working principle of the head gimbal assembly of the embodiment of FIG. 6A.

DETAILED DESCRIPTION

Figure 1A:
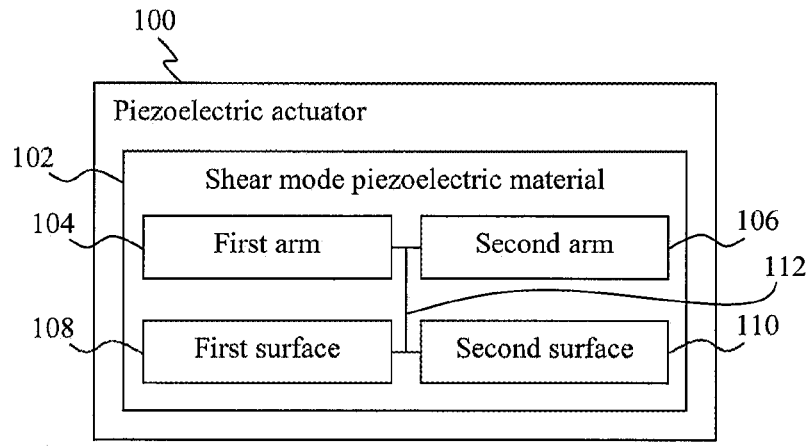
FIG. 1A shows a schematic block diagram of a piezoelectric actuator, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may provide a piezoelectric actuator and an apparatus for head positioning in high density hard disk drives. Various embodiments relate to a piezoelectric actuator and an apparatus using the piezoelectric actuator for positioning a read/write head in computer hard disk drives. For example, the apparatus may have a piezoelectric actuator operating in shear mode to position the read/write head in a high density hard disk drive for data storage.

Various embodiments of the piezoelectric actuator or micro-actuator may generate motion of shear displacement for fine track positioning of a read/write head in a disk drive.

Various embodiments may provide a piezoelectric single crystal micro-actuator that may operate in shear mode to directly position the read/write head in a hard disk drive.

Various embodiments may provide a block-shaped piezoelectric single crystal shear mode micro-actuator. Based on the test results and theoretical analyses, the displacement resolution of the block-shaped piezoelectric single crystal shear mode micro-actuator of various embodiments is approximately 2.17 to 2.55 nm/V for a frequency range of about 0 to 60 kHz. The displacement at a voltage of about 12 V may reach about 20 to 72 nm at frequencies up to 60 to over 100 kHz. The resonant frequency of the block piezoelectric single crystal shear mode micro-actuator with a Femto slider is found to be 108 kHz.

Various embodiments may provide an L-shaped piezoelectric single crystal micro-actuator that may operate in shear mode for head positioning in a hard disk drive. By using the L-shaped piezoelectric single crystal micro-actuator, more than 68% increment in shear displacement may be achieved compared to the block-shaped micro-actuator. The shear displacement at a voltage of about 12 V may reach about 121 nm and the resonance frequency of the L-shaped piezoelectric single crystal shear mode micro-actuator with a Femto slider may reach about 112.8 kHz.

The improved displacement and bandwidth achieved are able to meet the requirements of servo control of nano-positioning of a magnetic head in high track density hard disk drives, up to 1 to 10 TBit/in$^2$.

FIG. 1A shows a schematic block diagram of a piezoelectric actuator 100, according to various embodiments. The piezoelectric actuator 100 includes a shear mode piezoelectric material 102 including a first arm 104 and a second arm 106 intersecting each other, the shear mode piezoelectric material 102 having a polarization direction oriented at least substantially along a length of the first arm 104, wherein the shear mode piezoelectric material 102 has a first surface 108 and a second surface 110 opposite to the first surface 108, the first surface 108 and the second surface 110 being adapted to undergo a shear displacement relative to each other along an axis at least substantially parallel to the polarization direction in response to an electric field applied between the first surface 108 and the second surface 110 in a direction at least substantially perpendicular to the polarization direction. In FIG. 1A, the line represented as 112 is illustrated to show the relationship between the first arm 104, the second arm 106, the first surface 108 and the second surface 110, which may include electrical coupling and/or mechanical coupling.

The first surface 108 and at least a portion of the second surface 110 may be at least substantially parallel to the polarization direction.

The first arm 104 may have a first length and the second arm 106 may have a second length, wherein the first length is longer than the second length. Therefore, the first arm 104 may be the long arm while the second arm 106 may be the short arm.

In various embodiments, the piezoelectric actuator 100 further includes a first electrode on the first surface 108 and a second electrode on the second surface 110. The first electrode and/or the second electrode may include a conductive material, for example a metal, including but not limited to gold (Au), silver (Ag), aluminum (Al) and copper (Cu).

In various embodiments, the first surface 108 may be defined by a first side surface of the first arm 104 on a first side of the first arm 104, wherein the second arm 106 intersects the first arm 104 on a second side of the first arm 104, the first side and the second side being opposite sides, and wherein the second surface 110 may be defined by a second side surface of the first arm 104 on the second side and two adjacent second side surfaces of the second arm 106 on the second side.

In the context of various embodiments, the term "first side surface" may mean a surface on the first side, such that a first side surface of the first arm 104 means a surface of the first arm 104 on a first side of the first arm 104. Correspondingly, the term "second side surface" may mean a surface on the second side.

In various embodiments, the first arm 104 and the second arm 106 may intersect each other at least substantially orthogonally.

In various embodiments, an end of the first arm 104 and an end of the second arm 106 may intersect each other.

In various embodiments, the first arm 104 and the second arm 106 may intersect each other at least substantially orthogonally, and an end of the first arm 104 and an end of the second arm 106 may intersect each other, thereby forming an at least substantially L-shaped shear mode piezoelectric material 102.

In the context of various embodiments of an L-shaped piezoelectric material 102, between the two adjacent second side surfaces of the second arm 106, a first interior angle (e.g. $\theta_1$) may be provided or defined, between the second side surface of the first arm 104 and one second side surface of the two adjacent second side surfaces of the second arm 106 on the second side adjoining the second side surface of the first arm 104, a second interior angle (e.g. α) may be provided or defined, between the second side surface of the first arm 104 and a surface of the first arm 104 which the axis at least substantially parallel to the polarization direction intersects, a third interior angle (e.g. $\theta_3$) may be provided or defined, wherein each of the first interior angle (e.g. $\theta_1$), the third interior angle (e.g. $\theta_3$), and a conjugate angle (e.g. $\theta_2$) of the second interior angle (e.g. a) may be between about 90° and about 120°, for example between about 90° and about 115°, between about 90° and about 110°, between about 90° and about 100° or between about 95° and about 115°.

In the context of various embodiments, the term "interior angle" may mean an angle that lies on the inside of a polygon or a shape. The interior angle may be an angle formed by two sides of a polygon or shape that share an endpoint.

In the context of various embodiments, the term "conjugate angle" may mean an angle opposite to the interior angle such that the sum of the interior angle and the conjugate angle is 360°.

In various embodiments, each of the first interior angle (e.g. $\theta_1$), the conjugate angle (e.g. $\theta_2$) and the third interior angle (e.g. $\theta_3$) may be about 90°, thereby providing an L-shaped piezoelectric material 102 with right angles.

In various embodiments, the first interior angle (e.g. $\theta_1$) may be about 110.6°, the conjugate angle (e.g. $\theta_2$) may be about 113.5° and the third interior angle (e.g. $\theta_3$) may be about 92.96°, thereby providing an L-shaped piezoelectric material 102 with non-right angles. An L-shaped piezoelectric material 102 with non-right angles may provide or result in a larger shear displacement or deformation.

In various embodiments, the first surface 108 and at least a portion of the second surface 110 may be arranged at least substantially parallel to a (1$\bar{1}$0) plane or a (11$\bar{2}$) plane of the shear mode piezoelectric material (e.g. of a single crystal) 102, and wherein the polarization direction may be at least substantially perpendicular to a (111) plane of the shear mode piezoelectric material 102.

In the context of various embodiments, the shear mode piezoelectric material 102 may include at least one of a piezoelectric ceramic, a piezoelectric single crystal or a piezoelectric polymer.

In the context of various embodiments, the shear mode piezoelectric material 102 may have a perovskite structure.

In the context of various embodiments, a perovskite structure may mean a structure having a chemical formula of $ABX_3$, where 'A' and 'B' are two cations of different sizes, and X is an anion that bonds to both. In various embodiments, a material having a perovskite structure may have an at least substantially similar type of crystal structure as that of calcium titanium oxide ($CaTiO_3$).

In the context of various embodiments, the shear mode piezoelectric material 102 may include but not limited to $Pb(Zn_{1/3}Nb_{2/3})O_3$—$PbTiO_3$, $Pb(Mg_{1/3}Nb_{2/3})O_3$—$PbTiO_3$, $Pb(In_{1/2}Nb_{1/2})O_3$—$Pb(Mg_{1/3}Nb_{2/3})O_3$—$PbTiO_3$, and $Pb(Yb_{1/2}Nb_{1/2})O_3$—$PbTiO_3$.

In the context of various embodiments, the shear mode piezoelectric material 102 may be made of a ferroelectric relaxor single crystal material with a perovskite structure. The ferroelectric relaxor single crystal material with the perovskite structure may be selected from the group consisting of $(1-x)Pb(Zn_{1/3}Nb_{2/3})O_3\text{-}xPbTiO_3$ where x=0 to 1, e.g. x=0.04 to 0.09, $(1-x)Pb(Mg_{1/3}Nb_{2/3})O_3\text{-}xPbTiO_3$ where x=0 to 1, e.g. x=0.25 to 0.35, $(1-x-y)Pb(In_{1/2}Nb_{1/2})O_3\text{-}yPb(Mg_{1/3}Nb_{2/3})O_3\text{-}xPbTiO_3$ where x=0 to 1, e.g. x=0.25 to 0.35, and where y=0 to 1, e.g. y=0.3 to 0.35, $(1-x)Pb(Yb_{1/2}Nb_{1/2})O_3\text{-}xPbTiO_3$ where x=0 to 1, e.g. x=0.45 to 0.55, or their solid state solutions.

In the context of various embodiments, the ferroelectric relaxor single crystal material with the perovskite structure may be cut in a [111] direction, a [1$\bar{1}$0] direction and a [11$\bar{2}$] direction of the ferroelectric relaxor single crystal material, wherein the polarization direction oriented at least substantially along the length of the first arm 104 may be aligned at least substantially in the [111] direction, and wherein the first surface 108 and at least a portion of the second surface 110 may be arranged aligned at least substantially in the [1$\bar{1}$0] direction or the [11$\bar{2}$] direction such that the electric field is applied in the [1$\bar{1}$0] direction or the [11$\bar{2}$] direction that is oriented at least substantially perpendicular to the polarization direction.

In the context of various embodiments, the shear mode piezoelectric material 102 may have a piezoelectric shear coefficient, $d_{15}$, of between about 1500 pC/N and about 10000 pC/N, for example between about 1500 pC/N and about 6000 pC/N, between about 1500 pC/N and about 3000 pC/N, between about 3000 pC/N and about 6000 pC/N or between about 6000 pC/N and about 10000 pC/N.

In the context of various embodiments, the shear mode piezoelectric material 102 may be a single layer or may include a plurality of layers arranged one over the other.

Figure 1B:
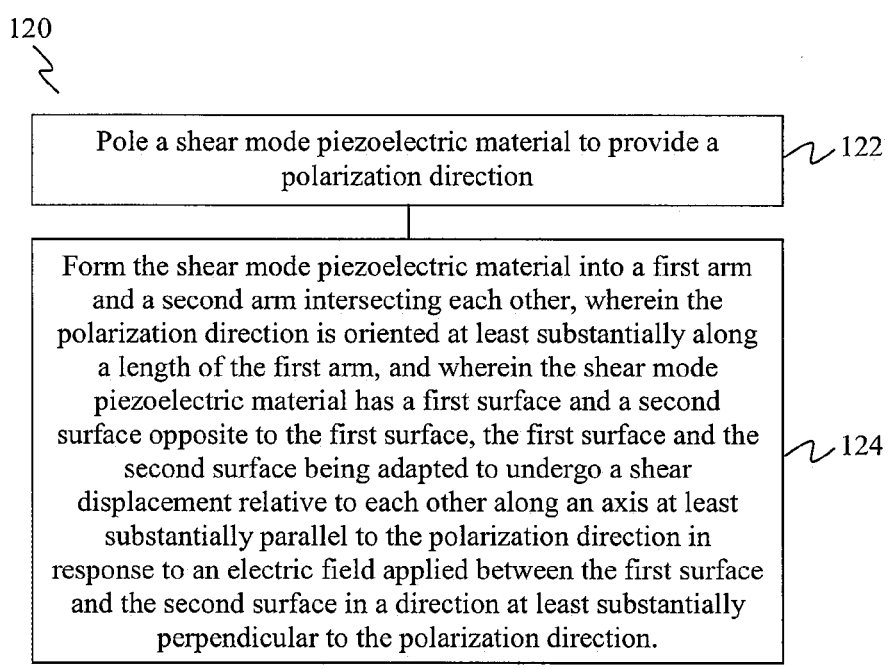
FIG. 1B shows a flow chart illustrating a method of forming a piezoelectric actuator, according to various embodiments.

FIG. 1B shows a flow chart 120 illustrating a method of forming a piezoelectric actuator, according to various embodiments.

At 122, a shear mode piezoelectric material is poled to provide a polarization direction.

At 124, the shear mode piezoelectric material is formed into a first arm and a second arm intersecting each other, wherein the polarization direction is oriented at least substantially along a length of the first arm, and wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

Figure 1C:
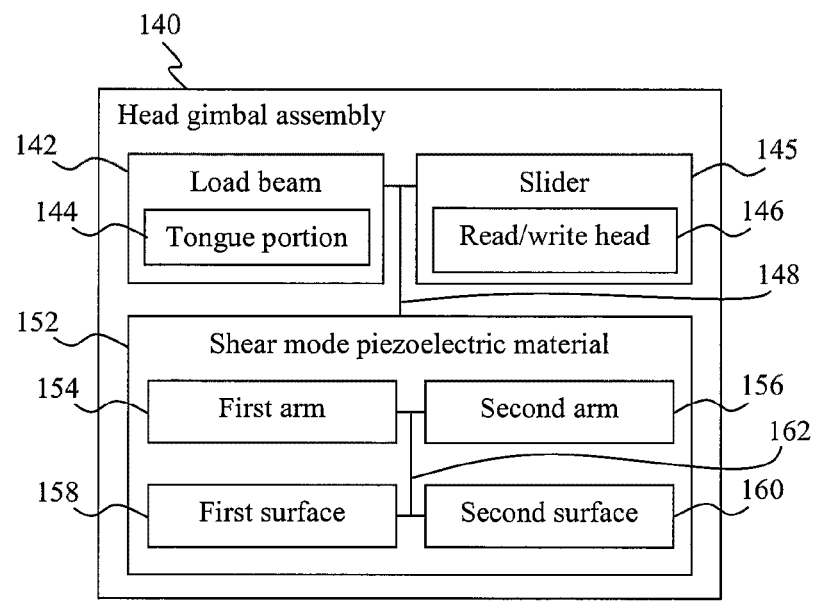
FIG. 1C shows a schematic block diagram of a head gimbal assembly for a disk drive, according to various embodiments.

FIG. 1C shows a schematic block diagram of a head gimbal assembly 140 for a disk drive, according to various embodiments. The head gimbal assembly 140 includes a load beam 142 including a tongue portion 144 at an end thereof, a slider 145 including a read/write head 146, and a shear mode piezoelectric material 152 coupled between the tongue portion 144 and the slider 145 (or the read/write head 146), wherein the shear mode piezoelectric material 152 includes a first arm 154 and a second arm 156 intersecting each other, wherein the shear mode piezoelectric material 152 has a polarization direction oriented at least substantially along a length of the first arm 154, and wherein the shear mode piezoelectric material 152 has a first surface 158 and a second surface 160 opposite to the first surface 158, the first surface 158 and the second surface 160 being adapted to undergo a shear displacement relative to each other for displacing the read/write head 146 (or the slider 145) along an axis at least substantially parallel to the polarization direction in response to an electric field applied between the first surface 158 and the second surface 160 in a direction at least substantially perpendicular to the polarization direction. In FIG. 1C, the line represented as 148 is illustrated to show the relationship between the load beam 142 with the tongue portion 144, the slider 145 including the read/write head 146 and the shear mode piezoelectric material 152, which may include electrical coupling and/or mechanical coupling, and the line represented as 162 is illustrated to show the relationship between the first arm 154, the second arm 156, the first surface 158 and the second surface 160 of the shear mode piezoelectric material 152, which may include electrical coupling and/or mechanical coupling.

The slider 145 and/or the read/write head 146 may be displaced along an axis at least substantially parallel to the polarization direction and at least substantially parallel to a surface of a platter of the disk drive, in response to an electric field applied between the first surface 158 and the second surface 160 in a direction at least substantially perpendicular to the polarization direction.

The first arm 154, the second arm 156, the first surface 158 and the second surface 160, may be as correspondingly described in the context of the first arm 104, the second arm 106, the first surface 108 and the second surface 110, respectively, of the piezoelectric actuator 100. Accordingly, the shear mode piezoelectric material 152 may be as correspondingly described in the context of the shear mode piezoelectric material 102 of the piezoelectric actuator 100.

In various embodiments, the read/write head 146 may be comprised in the slider 145, for example provided with or on or embedded in the slider 145.

The load beam 142 may define a longitudinal axis, and wherein the polarization direction may be oriented at least substantially perpendicular to the longitudinal axis.

In various embodiments, the first surface 158 may be defined by a first side surface of the first arm 154 on a first side of the first arm 154, wherein the second arm 156 intersects the first arm 154 on a second side of the first arm 154, the first side and the second side being opposite sides, and wherein the first surface 158 may be connected to the tongue portion 144. The read/write head 146 and/or the slider 145 may be connected to the second surface 160. This may mean that the surfaces (e.g. sidewise surfaces and end surfaces) of the shear mode piezoelectric material 152 extending between the first surface 158 and the second surface 160, and which may be at least substantially orthogonal to the first surface 158 and the second surface 160, may extend at least substantially orthogonally from the tongue portion 144 such that, for example when in use, may extend towards the platter. Accordingly, the first surface 158 and the second surface 160 may be at least substantially parallel to a surface of the platter.

In various embodiments, the first arm 154 and the second arm 156 may intersect each other at least substantially orthogonally.

In various embodiments, an end of the first arm 154 and an end of the second arm 156 may intersect each other.

In various embodiments, the first arm 154 and the second arm 156 may intersect each other at least substantially orthogonally, and wherein an end of the first arm 154 and an end of the second arm 156 may intersect each other, thereby forming an at least substantially L-shaped shear mode piezoelectric material 152.

In various embodiments, the first surface 158 and at least a portion of the second surface 160 may be arranged at least substantially parallel to a ($1\bar{1}0$) or ($11\bar{2}$) plane of the shear mode piezoelectric material 152, and wherein the polarization direction is at least substantially perpendicular to a (111) plane of the shear mode piezoelectric material 152.

In various embodiments, the first surface 158 and the second surface 160 may be arranged at least substantially parallel to a plane which intersects the longitudinal axis, and the slider 145 and/or the read/write head 146 may be connected to a surface of the shear mode piezoelectric material 152 extending between the first surface 158 and the second surface 160.

In various embodiments, the shear mode piezoelectric material 152 has a first end surface and a second end surface opposite to the first end surface, wherein each of the first end surface and the second end surface may extend between the first surface 158 and the second surface 160 and at least substantially orthogonal to the first surface 158 and the second surface 160, wherein the polarization direction is in a direction from the second end surface towards the first end surface, wherein the shear mode piezoelectric material 152 has a first sidewise surface and a second sidewise surface opposite to the first sidewise surface, wherein each of the first sidewise surface and the second sidewise surface may extend between the first surface 158 and the second surface 160 and at least substantially orthogonal to each the first surface 158, the second surface 160, the first end surface and the second end surface, and wherein the slider 145 and/or the read/write head 146 may be connected to the second sidewise surface.

In the context of various embodiments, the shear mode piezoelectric material 152 may be made of a ferroelectric relaxor single crystal material with a perovskite structure. The ferroelectric relaxor single crystal material with the perovskite structure may be selected from the group consisting of $(1-x)Pb(Zn_{1/3}Nb_{2/3})O_3\text{-}xPbTiO_3$ where x=0 to 1, e.g. x=0.04 to 0.09, $(1-x)Pb(Mg_{1/3}Nb_{2/3})O_3\text{-}xPbTiO_3$ where x=0 to 1, e.g. x=0.25 to 0.35, $(1-x-y)Pb(In_{1/2}Nb_{1/2})O_3\text{-}yPb(Mg_{1/3}Nb_{2/3})O_3\text{-}xPbTiO_3$ where x=0 to 1, e.g. x=0.25 to 0.35 and where y=0 to 1, e.g. y=0.3-0.35, $(1-x)Pb(Yb_{1/2}Nb_{1/2})O_3\text{-}xPbTiO_3$ where x=0 to 1, e.g. x=0.45 to 0.55, or their solid state solutions.

In the context of various embodiments, the ferroelectric relaxor single crystal material with the perovskite structure may be cut in a [111] direction, a [$1\bar{1}0$] direction and a [$11\bar{2}$] direction of the ferroelectric relaxor single crystal material, wherein the polarization direction oriented at least substantially along the length of the first arm 154 may be aligned at least substantially in the [111] direction, and wherein the first surface 158 and at least a portion of the second surface 160 may be arranged aligned at least substantially in the [$1\bar{1}0$] direction or the [$11\bar{2}$] direction such that the electric field is applied in the [$1\bar{1}0$] direction or the [$11\bar{2}$] direction that is oriented at least substantially perpendicular to the polarization direction.

In various embodiments, the head gimbal assembly 140 may further include a supporting member for coupling the shear mode piezoelectric material 152 to the tongue portion 144, wherein the first surface 158 may be defined by a first side surface of the first arm 154 on a first side of the first arm 154, wherein the second arm 156 intersects the first arm 154 on a second side of the first arm 154, the first side and the second side being opposite sides, wherein the first surface 158 may be connected to a surface of the supporting member, and wherein an other surface of the supporting member may be connected to the tongue portion 144, the other surface of the supporting member being at least substantially perpendicular to the surface of the supporting member. The read/write head 146 and/or the slider 145 may be connected to a surface (e.g. second sidewise surface) of the shear mode piezoelectric material 152 that extends between the first surface 158 and the second surface 160, and at least substantially orthogonal to the first surface 158 and the second surface 160, such that the read/write head 146 and/or the slider 145 may be displaced along an axis at least substantially parallel to a surface of a platter of a disk drive.

In various embodiments, the first surface 158 and at least a portion of the second surface 160 may be arranged at least substantially parallel to a ($1\bar{1}0$) or ($11\bar{2}$) plane of the shear mode piezoelectric material 152, the polarization direction may be at least substantially perpendicular to a (111) plane of the shear mode piezoelectric material 152, and wherein the read/write head 146 and/or the slider 145 may be connected to a surface of the shear mode piezoelectric material 152 that may be at least substantially parallel to a ($11\bar{2}$) or ($1\bar{1}0$) plane of the shear mode piezoelectric material 152.

In various embodiments, a first electrode may be formed or provided on the first surface 158 and a second electrode may be formed or provided on the second surface 160. The first electrode and/or the second electrode may include a conductive material, for example a metal, including but not limited to gold (Au), silver (Ag), aluminum (Al) and copper (Cu).

Figure 1D:
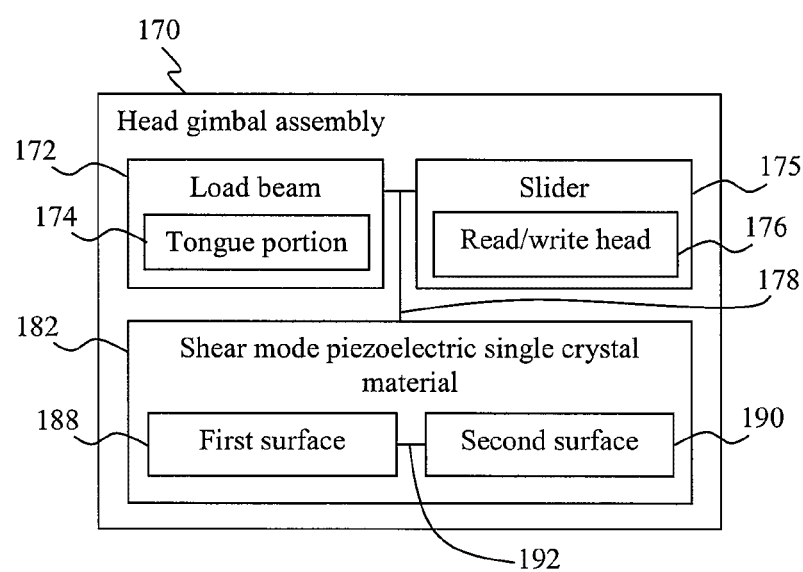
FIG. 1D shows a schematic block diagram of a head gimbal assembly for a disk drive, according to various embodiments.

FIG. 1D shows a schematic block diagram of a head gimbal assembly 170 for a disk drive, according to various embodiments. The head gimbal assembly 170 includes a load beam 172 including a tongue portion 174 at an end thereof, the load beam 172 defining a longitudinal axis, a slider 175 including a read/write head 176, and a shear mode piezoelectric single crystal material 182 coupled between the tongue portion 174 and the slider 175 (or the read/write head 176), wherein the shear mode piezoelectric single crystal material 182 has a polarization direction oriented at least substantially perpendicular to the longitudinal axis (or in other words, the shear mode piezoelectric single crystal 182 may be oriented with the polarization direction at least substantially perpendicular to the longitudinal axis), wherein the shear mode piezoelectric single crystal material 182 has a first surface 188 and a second surface 190 opposite to the first surface 188, the first surface 188 and the second surface 190 being adapted to undergo a shear displacement relative to each other for displacing the read/write head 176 (or the slider 175) along an axis at least substantially parallel to the polarization direction in response to an electric field applied between the first surface 188 and the second surface 190 in a direction at least substantially perpendicular to the polarization direction, wherein the first surface 188 and the second surface 190 are arranged at least substantially parallel to a ($1\bar{1}0$) plane or a ($11\bar{2}$) plane of the shear mode piezoelectric single crystal material 182, wherein the polarization direction is at least substantially perpendicular to a (111) plane of the shear mode piezoelectric single crystal material 182, and wherein the first surface 188 is coupled to the tongue portion 174.

In FIG. 1D, the line represented as 178 is illustrated to show the relationship between the load beam 172 with the tongue portion 174, the slider 175 including the read/write head 176 and the shear mode piezoelectric single crystal material 182, which may include electrical coupling and/or mechanical coupling, and the line represented as 192 is illustrated to show the relationship between the first surface 188 and the second surface 190 of the shear mode piezoelectric material single crystal 182, which may include electrical coupling and/or mechanical coupling.

In various embodiments, the second surface 190 may be coupled to the slider 175 and/or the read/write head 176.

The read/write head 176 and/or the slider 175 may be displaced along an axis at least substantially parallel to the polarization direction and at least substantially parallel to a surface of a platter of the disk drive, in response to an electric field applied between the first surface 188 and the second surface 190 in a direction at least substantially perpendicular to the polarization direction.

In the context of various embodiments, the shear mode piezoelectric single crystal material 182 may be made of a ferroelectric relaxor single crystal material with a perovskite structure. The ferroelectric relaxor single crystal material with the perovskite structure may be selected from the group consisting of $(1-x)Pb(Zn_{1/3}Nb_{2/3})O_3$-$xPbTiO_3$ where x=0 to 1, e.g. x=0.04 to 0.09, $(1-x)Pb(Mg_{1/3}Nb_{2/3})O_3$-$xPbTiO_3$ where x=0 to 1, e.g. x=0.25 to 0.35, $(1-x-y)Pb(In_{1/2}Nb_{1/2})O_3$-$yPb(Mg_{1/3}Nb_{2/3})O_3$-$xPbTiO_3$ where x=0 to 1, e.g. x=0.25 to 0.35 and where y=0 to 1, e.g. y=0.3-0.35, $(1-x)Pb(Yb_{1/2}Nb_{1/2})O_3$-$xPbTiO_3$ where x=0 to 1, e.g. x=0.45 to 0.55, or their solid state solutions.

In the context of various embodiments, the ferroelectric relaxor single crystal material with the perovskite structure may be cut in a [111] direction, a [1$\bar{1}$0] direction and a [11$\bar{2}$] direction of the ferroelectric relaxor single crystal material, wherein the polarization direction may be aligned at least substantially in the [111] direction, and wherein the first surface 188 and the second surface 190 may be arranged aligned at least substantially in the [1$\bar{1}$0] direction or the [11$\bar{2}$] direction such that the electric field is applied in the [1$\bar{1}$0] direction or the [11$\bar{2}$] direction that is oriented at least substantially perpendicular to the polarization direction.

In various embodiments, the shear mode piezoelectric single crystal material 182 has a first end surface and a second end surface opposite to the first end surface, wherein each of the first end surface and the second end surface may extend between the first surface 188 and the second surface 190 and at least substantially orthogonal to the first surface 188 and the second surface 190, wherein the polarization direction is in a direction from the second end surface towards the first end surface, wherein the shear mode piezoelectric single crystal material 182 has a first sidewise surface and a second sidewise surface opposite to the first sidewise surface, wherein each of the first sidewise surface and the second sidewise surface may extend between the first surface 188 and the second surface 190 and at least substantially orthogonal to each the first surface 188, the second surface 190, the first end surface and the second end surface, and wherein the read/write head 176 may be connected to the second sidewise surface.

In various embodiments, the head gimbal assembly 170 may further include a supporting member for coupling the shear mode piezoelectric single crystal material 182 to the tongue portion 174, wherein the first surface 188 and the second surface 190 may be arranged at least substantially parallel to a plane which intersects the longitudinal axis, wherein the first surface 188 may be connected to a surface of the supporting member, and wherein an other surface of the supporting member may be connected to the tongue portion 174, the other surface of the supporting member being at least substantially perpendicular to the surface of the supporting member, and wherein the read/write head 176 and/or the slider 175 may be connected to a surface of the shear mode piezoelectric single crystal material 182 extending between the first surface 188 and the second surface 190. The read/write head 176 and/or the slider 175 may be connected to a surface (e.g. second sidewise surface) of the shear mode piezoelectric single crystal material 182 that extends between the first surface 188 and the second surface 190, and at least substantially orthogonal to the first surface 188 and the second surface 190, such that the read/write head 176 and/or the slider 175 may be displaced along an axis at least substantially parallel to a surface of a platter of a disk drive.

In various embodiments, the shear mode piezoelectric single crystal material 182 may be a block-shaped shear mode piezoelectric material.

In various embodiments, the read/write head 176 may be comprised in the slider 175, for example provided with or on or embedded in the slider 175.

In various embodiments, the first surface 188 and the second surface 190 may be arranged at least substantially parallel to a (1$\bar{1}$0) plane of the shear mode piezoelectric single crystal material 182, the polarization direction may be at least substantially perpendicular to a (111) plane of the shear mode piezoelectric single crystal material 182, and the read/write head 176 and/or the slider 175 may be connected to a surface of the shear mode piezoelectric single crystal material 182 that may be at least substantially parallel to a (11$\bar{2}$) plane of the shear mode piezoelectric single crystal material 182.

In various embodiments, a first electrode may be formed or provided on the first surface 188 and a second electrode may be formed or provided on the second surface 190. The first electrode and/or the second electrode may include a conductive material, for example a metal, including but not limited to gold (Au), silver (Ag), aluminum (Al) and copper (Cu).

In the context of various embodiments, the term "read/write head" may include a magnetic head. The read/write head may be used for reading/writing information or data from/to a storage medium (e.g. a disk or a disk platter). The read/write head includes a reader and a writer. The read/write head is positioned over a storage medium and the reader may read signal or information from the storage medium and the writer may write information to the storage medium.

In the context of various embodiments, the term "polarization direction" may be interchangeably used with the term "poling direction".

In the context of various embodiments, the term "coupled" may include electrical coupling and/or mechanical coupling. In the context of various embodiments, the term "coupled" may include a direct coupling and/or an indirect coupling. For example, two devices being coupled to each other may mean that there is a direct coupling path between the two devices and/or there is an indirect coupling path between the two devices, e.g. via one or more intervening devices.

In the context of various embodiments, the term "connected" may include electrical connection and/or mechanical connection. In the context of various embodiments, the term "connected" may include a direct connection and/or an indirect connection. For example, two devices being connected to each other may mean that there is a direct connection between the two devices and/or there is an indirect connection between the two devices, e.g. via one or more intervening devices.

Figure 2:
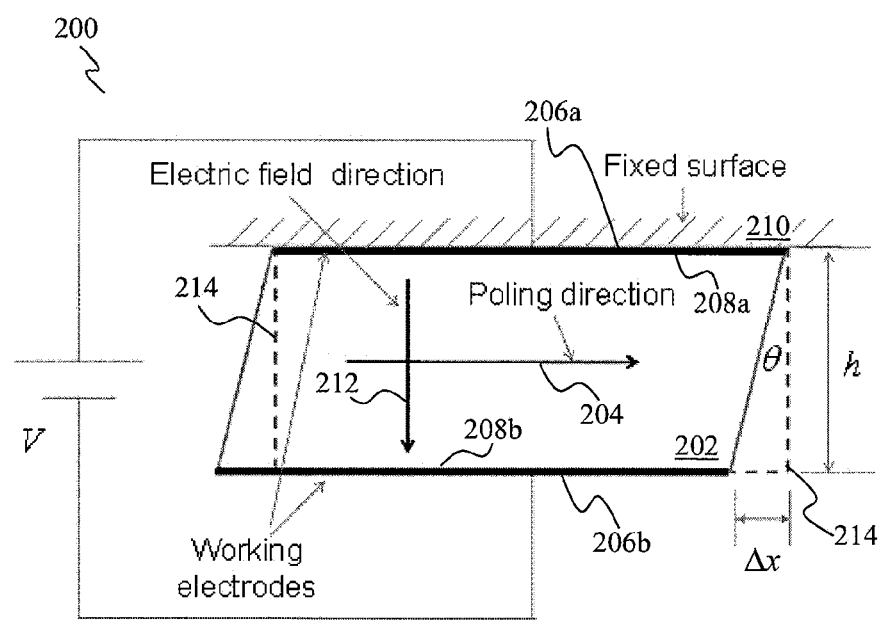
FIG. 2 shows a schematic set-up illustrating a shear deformation of a piezoelectric element under an applied electric potential.

FIG. 2 shows a schematic set-up 200 illustrating a shear deformation of a piezoelectric element 202 under an applied electric potential, V. The piezoelectric element 202 has a poling direction or polarization direction, as represented by the arrow 204, along a length of the piezoelectric element 202. The piezoelectric element 202 includes two working electrodes, in the form of a first electrode 206a on a first surface 208a of the piezoelectric element 202 and a second electrode 206b on a second surface 208b of the piezoelectric element 202. The first surface 208a with the first electrode 206a may be fixed or attached to a surface 210.

A piezoelectric material undergoes a shear deformation when an electric field is applied in a direction perpendicular to the polarization direction. As illustrated in FIG. 2, when a positive voltage, V, is applied across the first electrode 206a and the second electrode 206b, an electric field is generated in a direction, as represented by the arrow 212, from the first electrode 206a towards the second electrode 206b, being at least substantially perpendicular to the polarization direction 204. As a result, the piezoelectric element 202 experiences a shear deformation, from its initial state or original state as represented by the dotted line 214. Therefore, the first surface 208a and the second surface 208b of the piezoelectric element 202 are displaced laterally or in a shear manner, relative to each other. In this configuration, the second surface 208b is displaced backwardly relative to the first surface 208a. When a negative voltage is applied across the first electrode 206a and the second electrode 206b, the reverse occurs and the second surface 208b is displaced forwardly relative to the first surface 208a.

The shear displacement, Δx, as illustrated in FIG. 2, may be determined as $$\Delta x \approx \theta \cdot h = d_{15} \frac{V}{h} \cdot h = d_{15} V, \quad \text{(Equation 1)}$$

where $d_{15}$ is the piezoelectric shear coefficient, V is the applied electric potential or voltage, $\theta$ is the shear strain and h is the distance between the two working electrodes (first electrode 206a and second electrode 206b).

It may be observed that the shear displacement Δx may be only dependent on the piezoelectric shear coefficient $d_{15}$ and the applied voltage V for the piezoelectric shear actuator with the block shape (piezoelectric element 202) as shown in FIG. 2. At a fixed voltage value, the shear displacement may be solely governed by the material property $d_{15}$ and is usually very small. This may limit the usage of shear strain in some piezoelectric material in applications where a large shear displacement is required at a prescribed voltage.

Figure 3A:
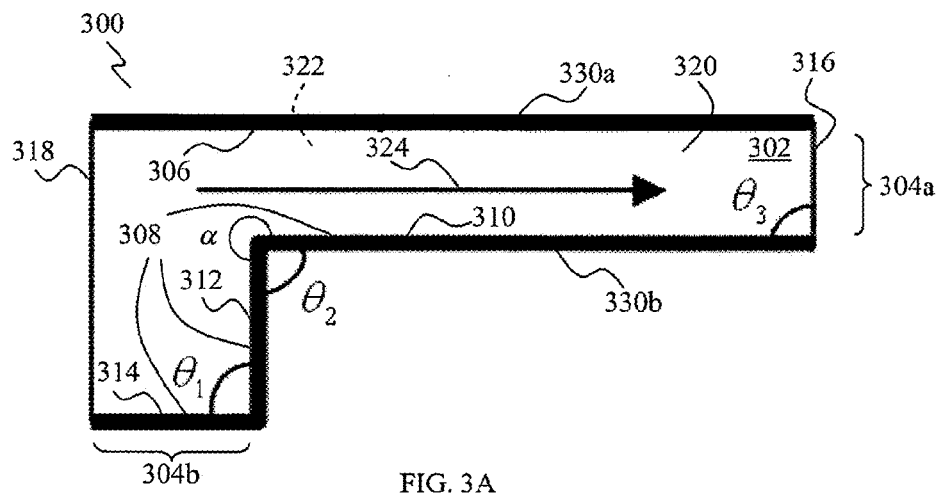
FIG. 3A shows a schematic cross sectional view of a piezoelectric actuator, according to various embodiments.

FIG. 3A shows a schematic cross sectional view of a piezoelectric actuator 300, according to various embodiments. The piezoelectric actuator 300 is an L-shaped piezoelectric shear mode actuator. The piezoelectric actuator 300 may be made of any piezoelectric material 302, including but not limited to piezoelectric ceramics, piezoelectric single crystals, and piezoelectric polymers.

The cross-section of the piezoelectric actuator 300 shows six planes forming the L-shape, which includes a first arm or beam 304a and a second arm or beam 304b, which intersect each other. An end of the first arm 304a and an end of the second arm 304b may intersect each other. In other words, the intersection point of the first arm 304a and the second arm 304b may include respective ends of the first arm 304a and the second arm 304b. The first arm 304a and the second arm 304b may intersect each other at least substantially orthogonally. The first arm 304a may be longer than the second arm 304b, and therefore the first arm 304a may be termed as the longer beam and the second arm 304b may be termed as the shorter beam.

Two planes of the piezoelectric material 302 or the piezoelectric actuator 300 include a first surface (e.g. top surface) 306, which may be defined by a surface of the first arm 304a, and a second surface (e.g. bottom surface) 308 opposed to the first surface 306, where the second surface 308 may be defined by a surface 310 of the first arm 304a and two surfaces 312, 314, adjacent to each other, of the second arm 304b. This means that the first surface 306 and the second surface 308 are opposed to each other and arranged on opposites sides of the piezoelectric material 302 or of the first arm 304a. As illustrated in FIG. 3A, the second arm 304b may intersect the first arm 304a on the side of the first arm 304a corresponding to the second surface 308. The first surface 306 and at least a portion of the second surface 308 (e.g. surfaces 310, 314), may be arranged at least substantially parallel to each other.

Two further planes of the piezoelectric material 302 or the piezoelectric actuator 300 include a first end surface 316 and a second end surface 318 opposed to the first end surface 316. The first end surface 316 and the second end surface 318 extend between the first surface 306 and the second surface 308. The first end surface 316 and the second end surface 318 may be at least substantially parallel to each other. The first end surface 316 and the second end surface 318 may be at least substantially orthogonal to the first surface 306 and/or and at least a portion of the second surface 308 (e.g. surfaces 310, 314).

The remaining two planes of the piezoelectric material 302 or the piezoelectric actuator 300 include a first sidewise surface 320 and a second sidewise surface 322 opposed to the first sidewise surface 320. The first sidewise surface 320 and the second sidewise surface 322 extend between the first surface 306 and the second surface 308. The first sidewise surface 320 and the second sidewise surface 322 may be at least substantially parallel to each other. The first sidewise surface 320 and the second sidewise surface 322 may be at least substantially orthogonal to the first surface 306 and/or and at least a portion of the second surface 308 (e.g. surfaces 310, 314). The first sidewise surface 320 and the second sidewise surface 322 may be at least substantially orthogonal to at least one of the first end surface 316 or the second end surface 318.

In various embodiments, the first surface 306 and at least a portion of the second surface 308 (e.g. surfaces 310, 314), may be arranged at least substantially parallel to a $(1\overline{1}0)$ plane of the piezoelectric material 302. The first end surface 316 and the second end surface 318 may be arranged at least substantially parallel to a (111) plane of the piezoelectric material 302. The first sidewise surface 320 and the second sidewise surface 322 may be arranged at least substantially parallel to a $(11\overline{2})$ plane of the piezoelectric material 302. The polarization direction 324 may be at least substantially perpendicular to a (111) plane of the piezoelectric material 302.

The piezoelectric actuator 300 or the piezoelectric material 302 may have a poling direction or a polarization direction, as represented by the arrow 324, in the length direction of the piezoelectric material 302. For example, the polarization direction 324 may be oriented at least substantially along the length of the first arm 304a, for example in a direction from the second end surface 318 towards the first end surface 316. In various embodiments, the first surface 306 and at least a portion of the second surface 308 (e.g. surfaces 310, 314), may be at least substantially parallel to the polarization direction 324. The surface 312 may be at least substantially orthogonal to the polarization direction 324.

The piezoelectric actuator 300 includes two working electrodes on surfaces of the piezoelectric material 302 at least substantially parallel to the polarization direction 324. In various embodiments, the working electrodes may be in the form of a first electrode 330a arranged or formed on the first surface 306, and a second electrode 330b arranged or formed on the second surface 308. This means that the second electrode 330b may cover the surface 314 and the inward elbow surfaces 310, 312 of the L-shaped piezoelectric material 302, as illustrated in FIG. 3A. Therefore, the first electrode 330a and the second electrode 330b are disposed on opposite sides of the piezoelectric actuator 300 or the piezoelectric material 302. The first electrode 330a may cover the entire first surface 306 and/or the second electrode 330b may cover the entire second surface 308.

In various embodiments, the first surface 306 and the second surface 308 may undergo a shear displacement relative to each other along an axis at least substantially parallel to the polarization direction 324 in response to a voltage or an electric field applied between the first surface 306 and the second surface 308 in a direction at least substantially perpendicular to the polarization direction 324. Therefore, the first surface 306 and the second surface 308 may be displaced laterally or in a shear manner, relative to each other. When a positive voltage is applied, meaning that an electric field is directed from the first surface 306 towards the second surface 308, the second surface 308 may be displaced backwardly (to the left) relative to the first surface 306. When a negative voltage is applied, meaning that an electric field is directed from the second surface 308 towards the first surface 306, the second surface 308 may be displaced forwardly (to the right) relative to the first surface 306.

As illustrated in FIG. 3A, a first interior angle $\theta_1$ may be provided or defined between the two adjacent surfaces 312, 314, of the second arm 304b. A second interior angle $\alpha$ may be provided or defined between the surface 310 and the surface 312, adjacent to each other. A conjugate angle $\theta_2$ of the second interior angle $\alpha$ may be defined. A third interior angle $\theta_3$ may be provided or defined between the surface 310 and the first end surface 316.

The L-shape of the piezoelectric actuator 300 or the piezoelectric material 302 may be determined by the three angles, $\theta_1$, $\theta_2$ and $\theta_3$. The piezoelectric actuator 300 may be an L-shaped piezoelectric shear mode actuator with right angles. This means that $\theta_1=\theta_2=\theta_3=90°$.

The L-shaped actuator 300 with the electrode configuration as described above and as illustrated in FIG. 3A may produce an improved or enhanced shear displacement as compared to a block-shaped actuator under the same electric potential.

In various embodiments, a ferroelectric relaxor single crystal material with a perovskite structure, for example $(1-x)Pb(Zn_{1/3}Nb_{2/3})O_3$-$xPTiO_3$ (x=0.06-0.07), may be used to produce the L-shaped piezoelectric material 302. When the actuator 300 has $\theta_1=\theta_2=\theta_3=90°$, with dimensions of about 1 mm in the [111] direction, about 0.5 mm in the [1$\bar{1}$0] direction and about 0.3 mm in the [112] direction, and with polarization direction 324 in the [111] direction, and an electric field applied in the [1$\bar{1}$0] direction, the shear displacement is found to be approximately 109 nm under approximately 12 V of electric potential, based on the simulated results 340 shown in FIG. 3B. As represented by the varying shades in FIG. 3B, the actuator 300 experiences a shear deformation where the shear displacement increases in the direction as represented by the arrow 342, from the top 344 of the actuator 300 towards the base 346 of the actuator 300, reaching about 109 nm towards the base 346.

The displacement magnitude may be improved by approximately 51.4% over a block-shaped actuator whose shear displacement is provided as $\Delta x = d_{15}V = 72$ nm, in which the piezoelectric shear coefficient $d_{15}$ of $(1-x)Pb(Zn_{1/3}Nb_{2/3})O_3$-$xPbTiO_3$ (x=0.06-0.07) is about 6000 pC/N. The deformation of the L-shaped piezoelectric actuator 300 with the electrode configuration as described above and as illustrated in FIG. 3A may not be in pure shear deformation, but may be mainly dominated by the shear strain.

In various embodiments, each of the angles $\theta_1$, $\theta_2$ and $\theta_3$ need not necessarily be a right angle. FIG. 3C shows a schematic cross sectional view of a piezoelectric actuator 350, according to various embodiments. The piezoelectric actuator 350 may be as described in the context of the piezoelectric actuator 300, except that the piezoelectric actuator 350 is an L-shaped piezoelectric shear mode actuator with non-right angles, where each of the angles $\theta_1$, $\theta_2$ and $\theta_3$ is not 90°. Therefore, like features or like components of the piezoelectric actuator 350 that are similarly present in the piezoelectric actuator 300 may be as described in the context of the piezoelectric actuator 300, and are not repeated.

By adjusting the values of the angles $\theta_1$, $\theta_2$ and $\theta_3$, the L-shape of the piezoelectric shear mode actuator 350 may be optimized to produce a larger shear displacement as compared to an L-shaped actuator (e.g. piezoelectric actuator 300) with $\theta_1=\theta_2=\theta_3=90°$.

Figure 3B:
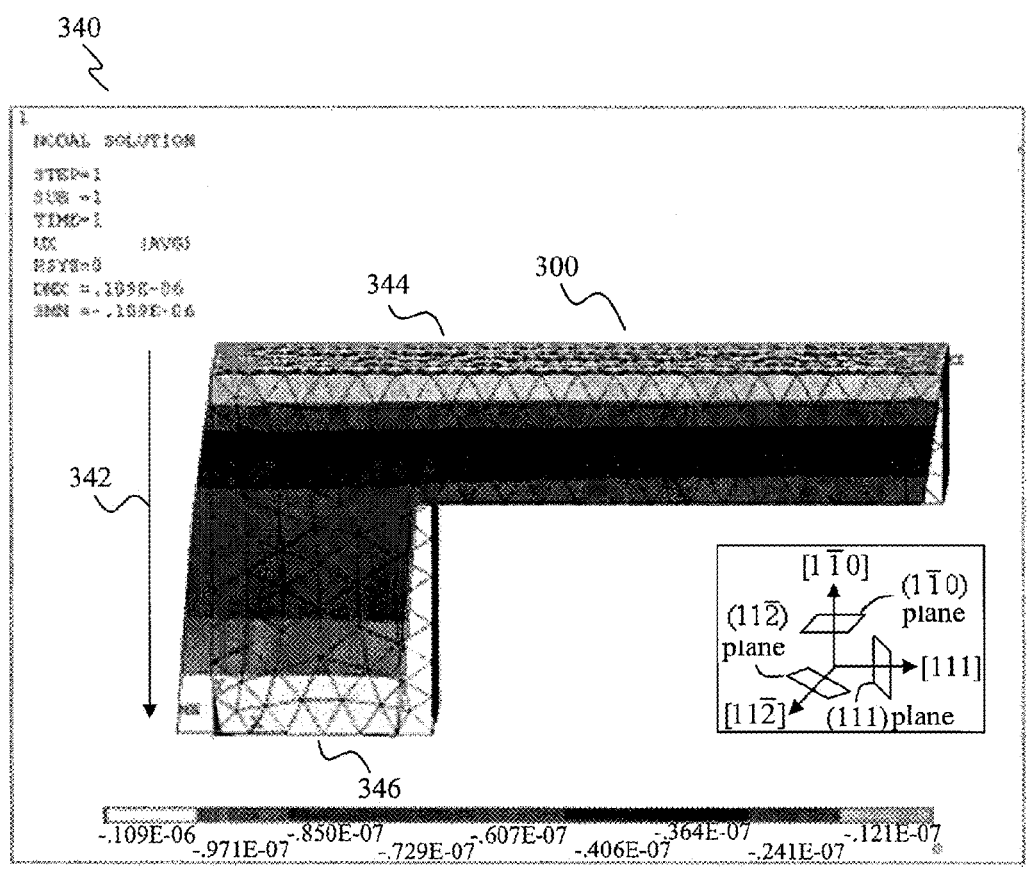
FIG. 3B shows a simulated result of shear displacement of a piezoelectric actuator based on the embodiment of FIG. 3A. Inset shows the coordinate of single crystal axes.
Figure 3C:
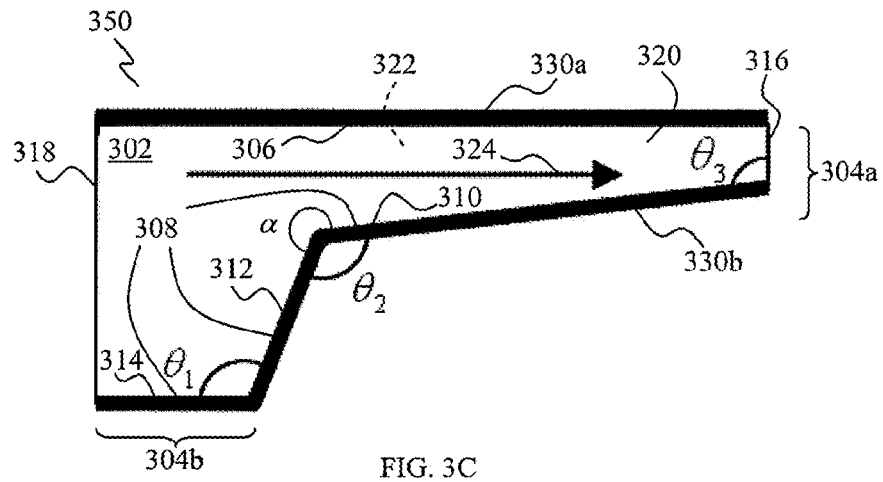
FIG. 3C shows a schematic cross sectional view of a piezoelectric actuator, according to various embodiments.
Figure 3D:
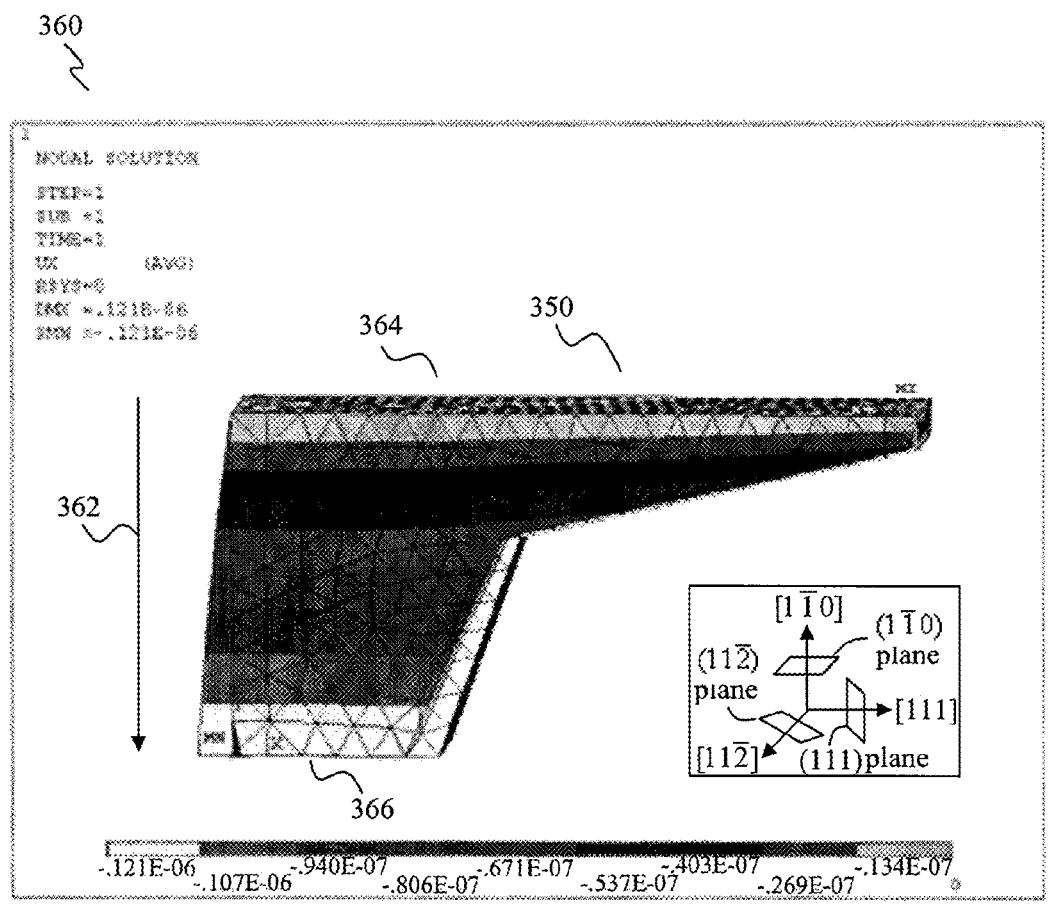
FIG. 3D shows a simulated result of shear displacement of a piezoelectric actuator based on the embodiment of FIG. 3C. Inset shows the coordinate of single crystal axes.

FIG. 3D shows a simulated result 360 of shear displacement of a piezoelectric actuator based on the embodiment of FIG. 3C, made of $(1-x)Pb(Zn_{1/3}Nb_{2/3})O_3$-$xPbTiO_3$ (x=0.06-0.07) single crystal. The simulated result 360 shows the shape of the actuator 350 optimized in terms of the shear displacement magnitude. The optimized L-shaped piezoelectric actuator 350 has dimensions of about 1 mm-long in the [111] direction, about 0.5 mm in the [1$\bar{1}$0] direction and about 0.3 mm in the [11$\bar{2}$] direction. The optimised angles $\theta_1$, $\theta_2$ and $\theta_3$ are $\theta_1=110.6°$, $\theta_2=113.5°$ and $\theta_3=92.96°$. When an electric potential of about 12 V is applied to the L-shaped piezoelectric shear mode actuator 350, the shear displacement generated by the piezoelectric actuator 350 is approximately 121 nm. As represented by the varying shades in FIG. 3D, the actuator 350 experiences a shear deformation where the shear displacement increases in the direction as represented by the arrow 362, from the top 364 of the actuator 350 towards the base 366 of the actuator 350, reaching about 121 nm towards the base 366. The shear displacement magnitude of about 121 nm is an increase of about 68% over a block-shaped actuator, and an increase of about 11% over the right-angled L-shaped piezoelectric actuator 300 of FIGS. 3A and 3B.

In various embodiments, the L-shaped piezoelectric actuator 300 and/or the L-shaped piezoelectric actuator 350 may be made of any piezoelectric material, including but not limited to piezoelectric ceramics, piezoelectric crystals, and piezoelectric polymers, and may be applicable to any applications that may utilize the increased piezoelectric shear displacement.

Figure 4:
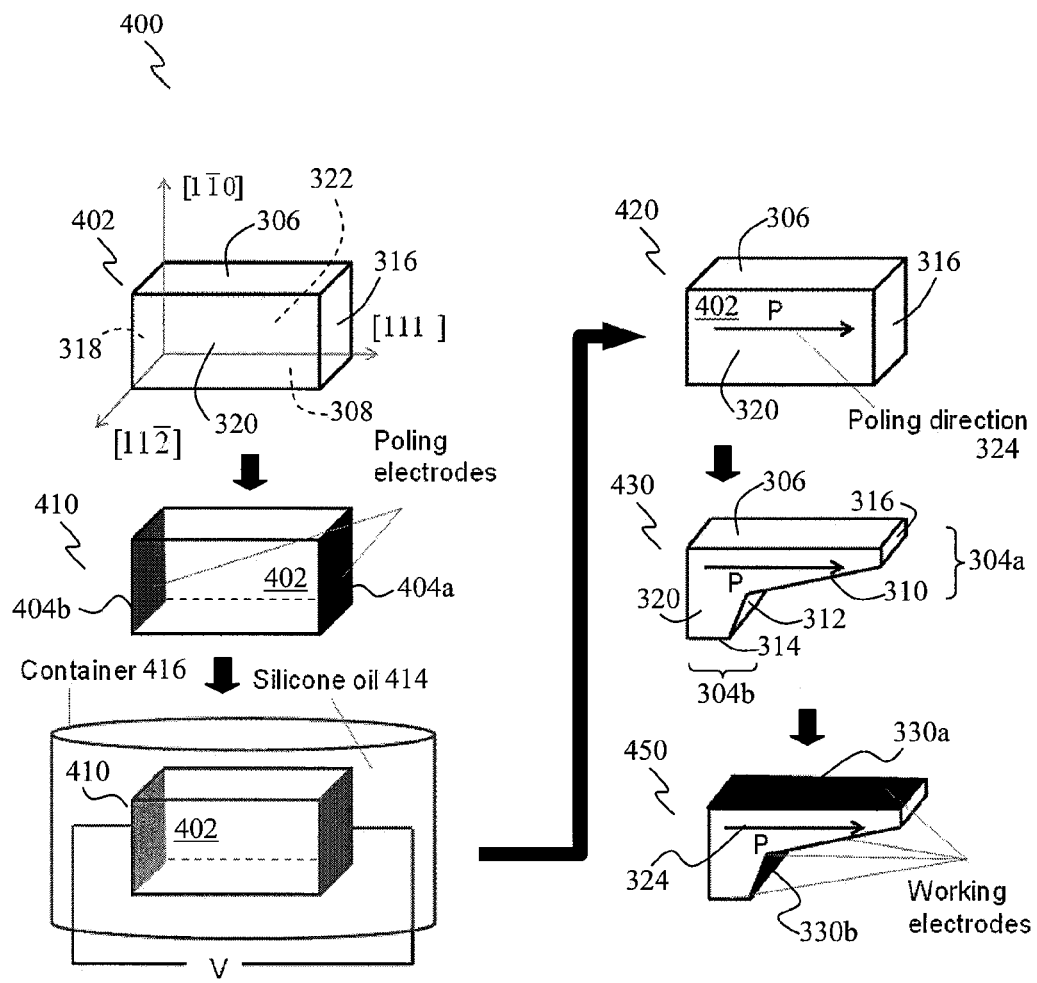
FIG. 4 shows a fabrication process for forming a piezoelectric actuator of the embodiments of FIGS. 3A to 3D, according to various embodiments.

FIG. 4 shows a fabrication process 400 for forming a piezoelectric actuator of the embodiments of FIGS. 3A to 3D, according to various embodiments. The fabrication process 400 may form an L-shaped piezoelectric shear mode microactuator, which may be designed to be used for positioning a read/write head in a hard disk drive. The fabrication process 400 may be employed for forming a single crystal-based L-shaped piezoelectric shear mode actuator.

A block-shaped piezoelectric single crystal material, for example with a composition of $(1-x)Pb(Zn_{1/3}Nb_{2/3})O_3$-$xPbTiO_3$ (x=0.06-0.07), is first cut in the [111], [1$\bar{1}$0] and [11$\bar{2}$] directions, to form a block-shaped piezoelectric material 402 with a top surface 306 and a bottom surface 208, each of which is at least substantially parallel to a (1$\bar{1}$0) plane of the piezoelectric material 402, a first end surface 316 and a second end surface 318, each of which is at least substantially parallel to a (111) plane of the piezoelectric material 402, and a first sidewise surface 320 and a second sidewise surface 322, each of which is at least substantially parallel to a (11$\bar{2}$) plane of the piezoelectric material 402.

Poling electrodes, in the form of a first poling electrode 404a and a second poling electrode 404b, each of about 200 nm in thickness, for example gold (Au) films, are deposited by sputtering on the opposite surfaces parallel to the (111) plane. Therefore, a structure 410 having the piezoelectric material 402, with the first poling electrode 404a and the second poling electrode 404b deposited respectively on the first end surface 316 and the second end surface 318 may be obtained.

The $(1-x)Pb(Zn_{1/3}Nb_{2/3})O_3$-$xPbTiO_3$ (x=0.06-0.07) single crystal, of the structure 410, may be subsequently poled in the [111] direction at room temperature in silicone oil 414, with a poling electric field of about 1 kV/mm applied through the first poling electrode 404a and the second poling electrode 404b, with the application of a voltage, V. The structure 410 may be placed in a container 416 containing the silicone oil 414.

After poling, the polarization of the piezoelectric material 402 is aligned in the [111] direction. The poling electrodes (the first poling electrode 404a and the second poling electrode 404b) on the (111) surface planes (the first end surface 316 and the second end surface 318) may be removed by etching, for example gold etching. A structure 420, having the piezoelectric material 402 with a polarization direction 324 aligned in the [111] direction, may be obtained.

The L-shape may then be formed by removing the excess fraction or portion of the piezoelectric material 402, for example by using at least one of a chemical etching process, a mechanical cut, a mechanical abrasion, an ultrasonic cut, or a laser cut. As a result, an L-shaped piezoelectric material or structure 430 having a first arm 304a, a second arm 304b, and a bottom surface composed of surfaces 310, 312, 314, may be obtained.

Gold (Au) films with a thickness of about 200 nm may subsequently be deposited by sputtering to form the working electrodes on the top surface 306 parallel to the (1$\bar{1}$0) plane and the cut surfaces 310, 312, 314 of the $(1-x)Pb(Zn_{1/3}Nb_{2/3})O_3$-$xPbTiO_3$ (x=0.06-0.07) single crystal material 430. Therefore, a structure 450 having the L-shaped piezoelectric material 430, with a first working electrode 330a deposited on the surface 306 and a second working electrode 330b deposited on the surfaces 310, 312, 314, may be obtained.

It should be appreciated that while the structures 430, 450 shown in FIG. 4 is of an L-shape with non-right angles, similar to the embodiment of FIGS. 3C and 3D, the fabrication process 400 may also be employed to form structures or actuators of an L-shape with right angles, similar to the embodiment of FIGS. 3A and 3B.

Figure 5A:
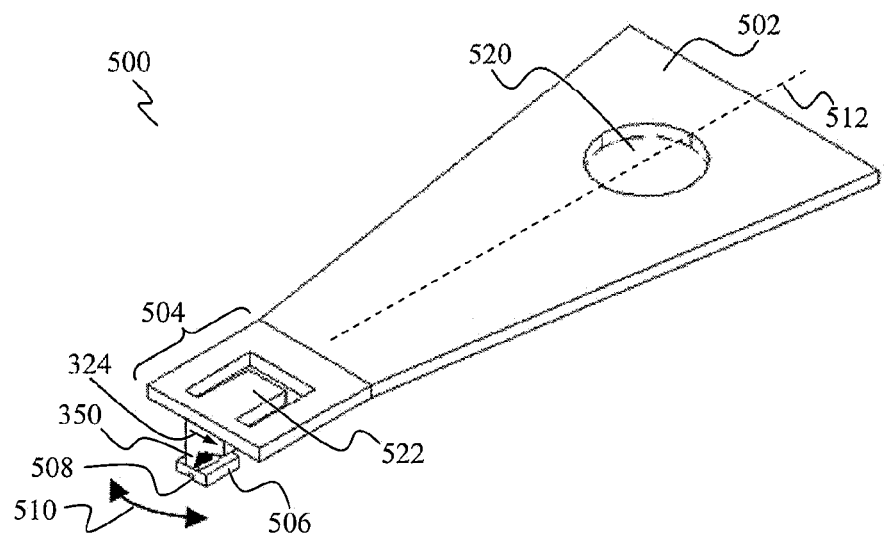
FIG. 5A shows an isometric view of a head gimbal assembly, according to various embodiments.
Figure 5B:
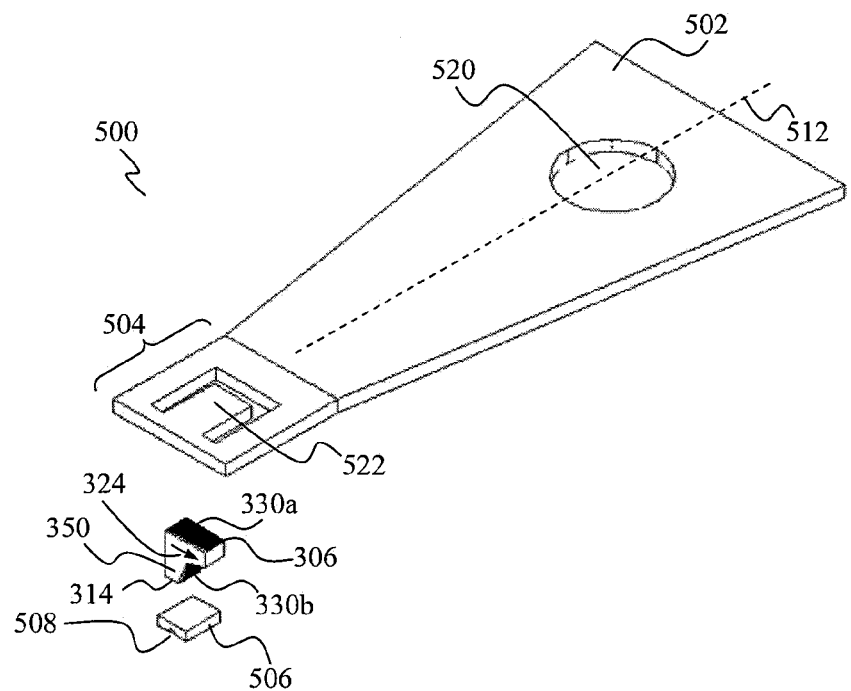
FIG. 5B shows an isometric view of parts of the head gimbal assembly of the embodiment of FIG. 5A, in a disassembled form.

Any one of the L-shaped piezoelectric shear mode actuators 300, 350 may be used in an apparatus for head positioning in hard disk drives. FIG. 5A shows an isometric view of a head gimbal assembly 500, according to various embodiments, while FIG. 5B shows an isometric view of parts of the head gimbal assembly 500, in a disassembled form. The head gimbal assembly 500 may employ an L-shaped piezoelectric actuator or micro-actuator operating in shear mode. As a non-limiting example, the head gimbal assembly 500 may employ the L-shaped piezoelectric single crystal micro-actuator 350 of the embodiments of FIGS. 3C and 3D, operating in shear mode, to drive a read/write head directly. It should be appreciated that the L-shaped piezoelectric single crystal micro-actuator 300 of the embodiments of FIGS. 3A and 3B may instead be employed in the head gimbal assembly 500.

The head gimbal assembly 500, which may be used for a hard disk drive (HDD), may include a load beam 502, a tongue portion 504, a slider 506 including a read/write head 508, and an L-shaped piezoelectric single crystal micro-actuator 350. The piezoelectric micro-actuator 350 operates in shear mode under an electric field or voltage applied through or across the two working electrodes (first electrode 330a and second electrode 330b) and the piezoelectric micro-actuator 350 is coupled between the tongue portion 504 and the slider 506 to provide displacement to position the slider 506 and thus, the read/write head 508 may move in directions, as represented by the double-headed arrow 510, perpendicular to the axial direction (e.g. longitudinal axis 512), of the load beam 502, and parallel to the surface of a platter (not shown). The piezoelectric micro-actuator 350 has a polarization direction 324 that is at least substantially perpendicular to the longitudinal axis 512.

A hole 520 is defined through the load beam 502, through which a pivot bearing (not shown) may pass through such that the load beam 502 may rotate about the pivot bearing. The tongue portion 504 is positioned or coupled to one end of the load beam 502. The tongue portion 504 may be flexible. The piezoelectric micro-actuator 350 may be coupled to the tongue portion 504, for example to a flexure portion 522 of the tongue portion 504.

The surface 306, with the first electrode 330a, may be connected to the tongue portion 504. The surface 314, with the second electrode 330b, may be connected to the slider 506.

The piezoelectric micro-actuator 350 may be made of single crystal with a composition of $(1-x)Pb(Zn_{1/3}Nb_{2/3})O_3$-$xPbTiO_3$ (x=0.06-0.07) (PZN-PT) with the polarization direction 324 in the [111] direction corresponding to the PZN-PT single crystal, and working electrodes (first electrode 330a and second electrode 330b) on the surfaces (surfaces 306, 314) parallel to the (1$\bar{1}$0) plane and on the inward elbow surfaces (surfaces 310, 312, FIG. 3C).

The piezoelectric micro-actuator 350 may have similar parameters as described in the context of the embodiments of FIGS. 3C and 3D. This means that the piezoelectric micro-actuator 350 employed in the head gimbal assembly 500 may be made of PZN-PT with $d_{15}$=6000 pC/N, with dimensions of about 1 mm in the [111] direction, about 0.5 mm in the [1$\bar{1}$0] direction and about 0.3 mm in the [11$\bar{2}$] direction, and $\theta_1$=110.6°, $\theta_2$=113.5° and $\theta_3$=92.96°. Based on these parameters, the displacement in the [111] direction may reach about 121 nm at an applied voltage of about 12 V, as illustrated in FIG. 3D, which is about 68% larger than that of a block-shaped PZN-PT micro-actuator of a similar size.

FIGS. 5C to 5E show the working principle of the head gimbal assembly 500 of the embodiment of FIG. 5A, illustrating the working mechanism of the L-shaped piezoelectric shear mode micro-actuator 350, coupled between the tongue portion 504 and the slider 506, for read/write head positioning, relative to the disk platter 550. FIGS. 5C to 5E show respective front views of the head gimbal assembly 500.

FIG. 5C shows the head gimbal assembly 500 including the L-shaped piezoelectric micro-actuator 350 in the initial state or original state where no voltage or electric field is applied to the micro-actuator 350, and therefore no shear deformation of the micro-actuator 350. The coordinates of single crystal axes are also illustrated in FIG. 5C.

When an electric potential is applied to the working electrodes (first electrode 330a and second electrode 330b) of the L-shaped piezoelectric shear mode micro-actuator 350, the micro-actuator 350 undergoes a shear deformation which displaces the slider 506 together with the read/write head 508 in a direction at least substantially perpendicular to the axial direction (longitudinal axis 512, FIGS. 5A and 5B) of the load beam (502, FIGS. 5A and 5B) and at least substantially parallel to the surface 552 of the platter 550. The direction of shear deformation may be controlled by reversing the direction of the electric field applied as shown in FIGS. 5D and 5E.

As shown in FIG. 5D, when a positive voltage is applied to the first electrode 330a and the second electrode 330b, with an electric field direction as represented by the arrow 560, the micro-actuator 350 undergoes deformation under the electric potential such that the slider 506 is displaced in a leftward direction relative to the initial state (as viewed from the front side).

As shown in FIG. 5E, when a negative voltage is applied to the first electrode 330a and the second electrode 330b, with an electric field direction as represented by the arrow 562, the micro-actuator 350 undergoes deformation under the reverse electric potential such that the slider 506 is displaced in a rightward direction relative to the initial state (as viewed from the front side).

Figure 6A:
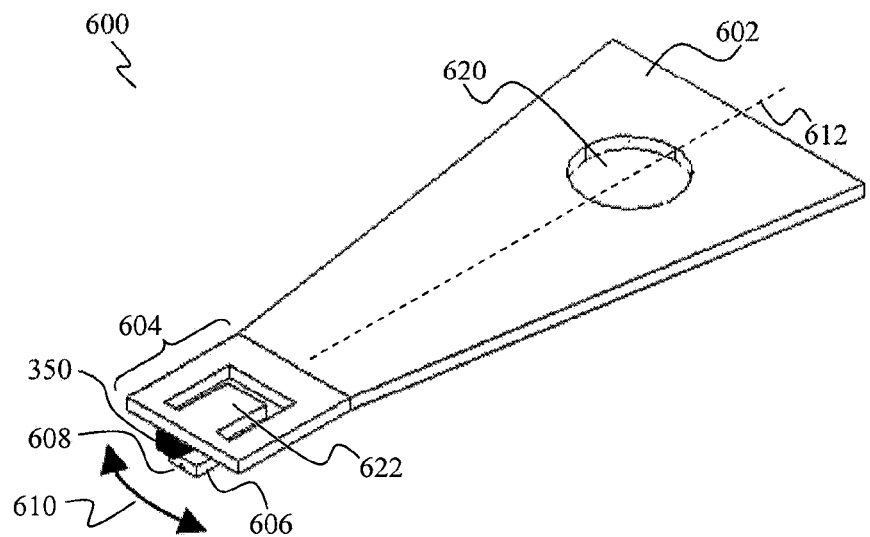
FIG. 6A shows an isometric view of a head gimbal assembly, according to various embodiments.
Figure 6B:
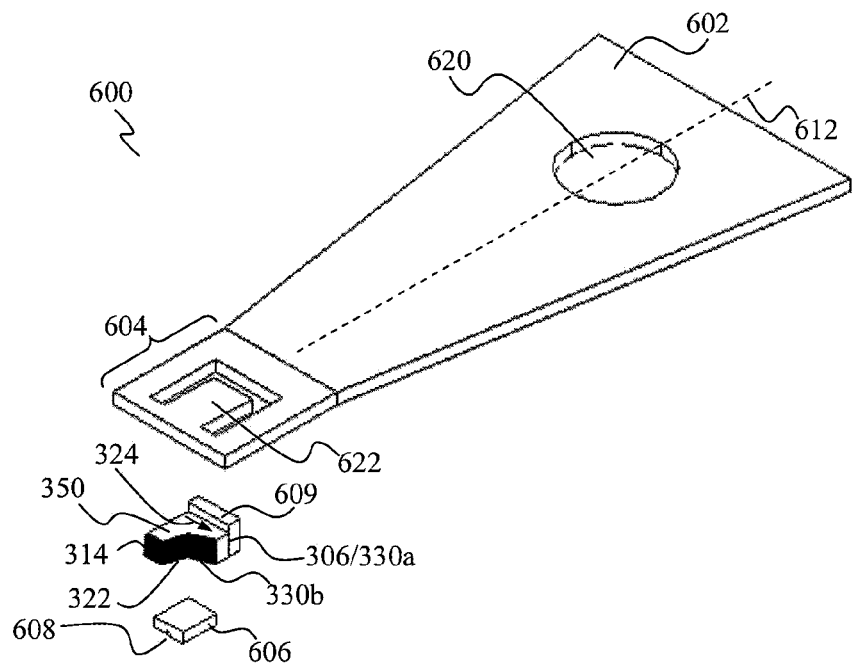
FIG. 6B shows an isometric view of parts of the head gimbal assembly of the embodiment of FIG. 6A, in a disassembled form.

FIG. 6A shows an isometric view of a head gimbal assembly 600, according to various embodiments, while FIG. 6B shows an isometric view of parts of the head gimbal assembly 600, in a disassembled form. The head gimbal assembly 600 may employ an L-shaped piezoelectric actuator or micro-actuator operating in shear mode. As a non-limiting example, the head gimbal assembly 600 may employ the L-shaped piezoelectric single crystal micro-actuator 350 of the embodiments of FIGS. 3C and 3D, operating in shear mode, to drive a read/write head directly. It should be appreciated that the L-shaped piezoelectric single crystal micro-actuator 300 of the embodiments of FIGS. 3A and 3B may instead be employed in the head gimbal assembly 600.

The head gimbal assembly 600, which may be used for a hard disk drive (HDD), may include a load beam 602, a tongue portion 604, a slider 606 including a read/write head 608, a supporting member 609 and an L-shaped piezoelectric single crystal micro-actuator 350. The piezoelectric micro-actuator 350 operates in shear mode under an electric field or voltage applied through or across the two working electrodes (first electrode 330a and second electrode 330b) and the piezoelectric micro-actuator 350 is coupled between the supporting member 609 and the slider 606, with the supporting member 609 coupled to the tongue portion 604, so as to provide displacement to position the slider 606. Thus, the read/write head 608 may move in directions, as represented by the double-headed arrow 610, perpendicular to the axial direction (e.g. longitudinal axis 612), of the load beam 602, and parallel to the surface of a platter (not shown). The piezoelectric micro-actuator 350 has a polarization direction 324 that is at least substantially perpendicular to the longitudinal axis 612.

A hole 620 is defined through the load beam 602, through which a pivot bearing (not shown) may pass through such that the load beam 602 may rotate about the pivot bearing. The tongue portion 604 is positioned or coupled to one end of the load beam 602. The tongue portion 604 may be flexible. The supporting member 609 may be coupled to the tongue portion 604, for example to a flexure portion 622 of the tongue portion 604.

The surface 306, with the first electrode 330a, may be connected to the supporting member 609. The slider 606 may be connected to the surface 322. While there may be challenges in that the coupling of the slider 606 to the surface 322 may compromise the shear displacement, this configuration for the head gimbal assembly 600 may provide better or improved electrical and mechanical bonding of the assembly of the piezoelectric micro-actuator 350 and the slider 606, and/or of the assembly 600.

The piezoelectric micro-actuator 350 may be made of single crystal with a composition of $(1-x)Pb(Zn_{1/3}Nb_{2/3})O_3$-$xPbTiO_3$ (x=0.06-0.07) (PZN-PT), poled in the [111] direction corresponding to the PZN-PT single crystal. This means that the PZN-PT single crystal has a polarization direction 324 in the [111] direction. The piezoelectric micro-actuator 350 includes working electrodes (first electrode 330a and second electrode 330b) on the surfaces (surfaces 306, 314) parallel to the $(1\bar{1}0)$ plane and on the inward elbow surfaces (surfaces 310, 312, FIG. 3C). Therefore, the L-shaped piezoelectric single crystal shear mode micro-actuator 350 may be coupled to the supporting member 609 on the major surface (i.e. surface 306) that is at least substantially parallel to the $(1\bar{1}0)$ plane. The slider 606 may be coupled to the micro-actuator 350 on a surface (e.g. surface 322) that is at least substantially parallel to the $(11\bar{2})$ plane.

The piezoelectric micro-actuator 350 may have similar parameters as described in the context of the embodiments of FIGS. 3C and 3D.

FIGS. 6C to 6E show the working principle of the head gimbal assembly 600 of the embodiment of FIG. 6A, illustrating the working mechanism of the L-shaped piezoelectric shear mode micro-actuator 350, coupled between the slider 606 and the supporting member 609, which in turn is coupled to the tongue portion 604, for read/write head positioning, relative to the disk platter 650. FIGS. 6C to 6E show respective front views of the head gimbal assembly 600.

FIG. 6C shows the head gimbal assembly 600 including the L-shaped piezoelectric micro-actuator 350 in the initial state or original state where no voltage or electric field is applied to the micro-actuator 350, and therefore no shear deformation of the micro-actuator 350. The coordinates of single crystal axes are also illustrated in FIG. 6C.

When an electric potential is applied to the working electrodes (first electrode 330a and second electrode 330b) of the L-shaped piezoelectric shear mode micro-actuator 350, the micro-actuator 350 undergoes a shear deformation which displaces the slider 606 together with the read/write head 608, so as to position the read/write head 608 in directions at least substantially perpendicular to the axial direction (longitudinal axis 612, FIGS. 6A and 6B) of the load beam (602, FIGS. 6A and 6B) and at least substantially parallel to the surface 652 of the platter 650. The direction of shear deformation or displacement may be controlled by reversing the direction of the electric field applied as shown in FIGS. 6D and 6E.

As shown in FIG. 6D, when a positive voltage is applied to the first electrode 330a and the second electrode 330b, with an electric field direction as represented by the circle 660 with a cross therewithin to denote an inward direction into the page, the micro-actuator 350 undergoes deformation under the electric potential such that the slider 606 is displaced in a leftward direction relative to the initial state (as viewed from the front side).

As shown in FIG. 6E, when a negative voltage is applied to the first electrode 330a and the second electrode 330b, with an electric field direction as represented by the circle 662 with a dot therewithin to denote an outward direction out of the page, the micro-actuator 350 undergoes deformation, in a reverse direction, under the reverse electric potential such that the slider 606 is displaced in a rightward direction relative to the initial state (as viewed from the front side).

Various embodiments may provide a head gimbal assembly including a block-shaped piezoelectric actuator or micro-actuator operating in shear mode to drive a read/write head directly.

Figure 7A:
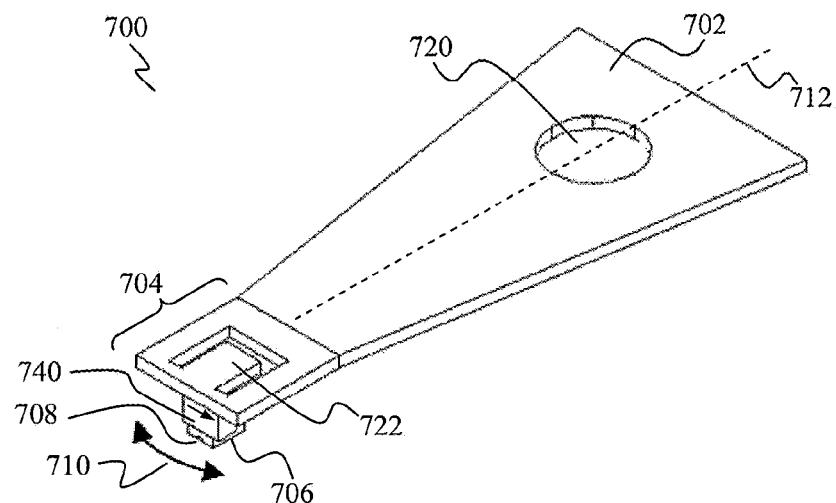
FIG. 7A shows an isometric view of a head gimbal assembly, according to various embodiments.
Figure 7B:
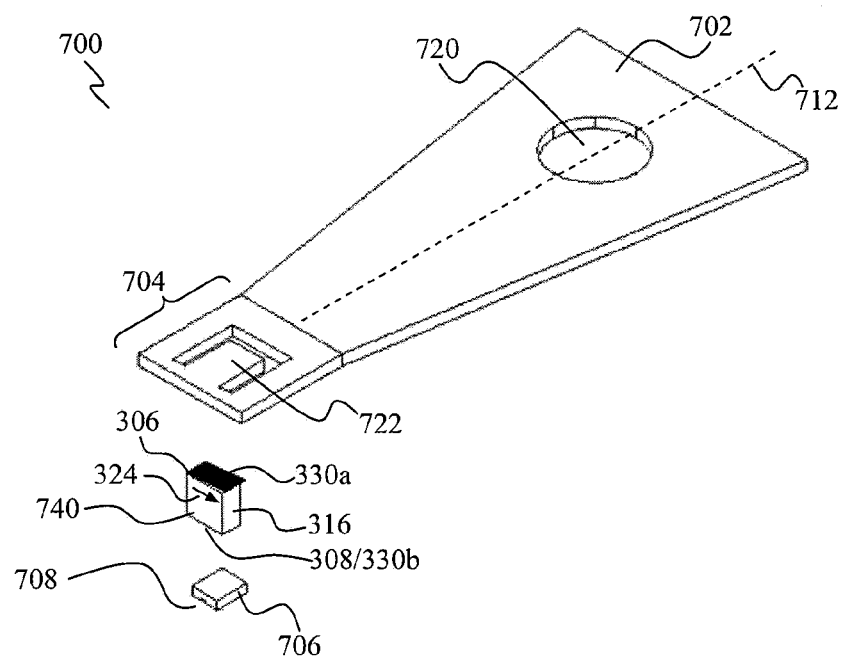
FIG. 7B shows an isometric view of parts of the head gimbal assembly of the embodiment of FIG. 7A, in a disassembled form.

FIG. 7A shows an isometric view of a head gimbal assembly 700, according to various embodiments, while FIG. 7B shows an isometric view of parts of the head gimbal assembly 700, in a disassembled form. The head gimbal assembly 700, which may be used for a hard disk drive (HDD), may include a load beam 702, a tongue portion 704, a slider 706 including a read/write head 708, and a block-shaped piezoelectric single crystal micro-actuator 740.

For the purpose of correlation with the L-shaped piezoelectric actuator 300 of the embodiments of FIGS. 3A and 3B and the L-shaped piezoelectric actuator 350 of the embodiments of FIGS. 3C-3D, 5A-5E and 6A-6E, like surfaces, electrodes and poling direction of the block-shaped piezoelectric single crystal micro-actuator 740 that are similarly present in the L-shaped piezoelectric actuator 300 and the L-shaped piezoelectric actuator 350 are denoted by the same like reference numerals.

The piezoelectric micro-actuator 740 operates in shear mode under an electric field or voltage applied through or across the two working electrodes (first electrode 330a and second electrode 330b) and the piezoelectric micro-actuator 740 is coupled between the tongue portion 704 and the slider 706 to position the slider 706 and thus the read/write head 708 in directions, as represented by the double-headed arrow 710, perpendicular to the axial direction (e.g. longitudinal axis 712) of the load beam 702, and parallel to the surface of a platter (not shown). The piezoelectric micro-actuator 740 has a polarization direction 324 that is at least substantially perpendicular to the longitudinal axis 712.

A hole 720 is defined through the load beam 702, through which a pivot bearing (not shown) may pass through such that the load beam 702 may rotate about the pivot bearing. The tongue portion 704 is positioned or coupled to one end of the load beam 702. The tongue portion 704 may be flexible. The piezoelectric micro-actuator 740 may be coupled to the tongue portion 704, for example to a flexure portion 722 of the tongue portion 704.

The surface (e.g. top surface) 306 of the piezoelectric micro-actuator 740, with the first electrode 330a, may be connected to the tongue portion 704. The surface (e.g. bottom surface) 308, with the second electrode 330b, may be connected to the slider 706.

The block-shaped piezoelectric micro-actuator 740 may be made of single crystal of PZN-PT, with a composition of $(1-x)Pb(Zn_{1/3}Nb_{2/3})O_3$-$xPTiO_3$ (x=0.06-0.07), and cut in the [111], [1$\bar{1}$0] and [11$\bar{2}$] directions, and poled in the [111] direction corresponding to the PZN-PT single crystal. This means that the PZN-PT single crystal has a polarization direction 324 in the [111] direction. The piezoelectric micro-actuator 740 includes working electrodes (first electrode 330a and second electrode 330b) on the surfaces (surfaces 306, 308) parallel to the (1$\bar{1}$0) plane.

Figure 7C:
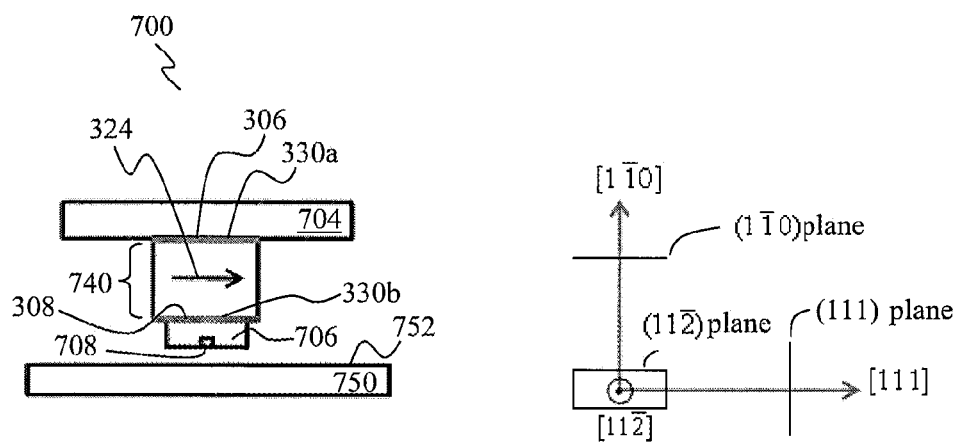
FIGS. 7C to 7E show the working principle of the head gimbal assembly of the embodiment of FIG. 7A.
Figure 7D:
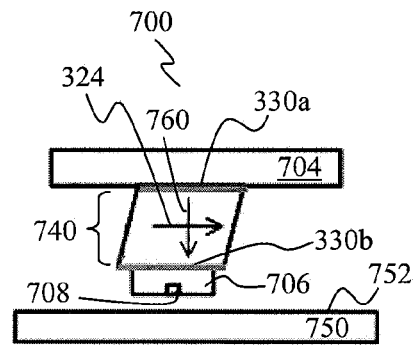
Figure 7E:
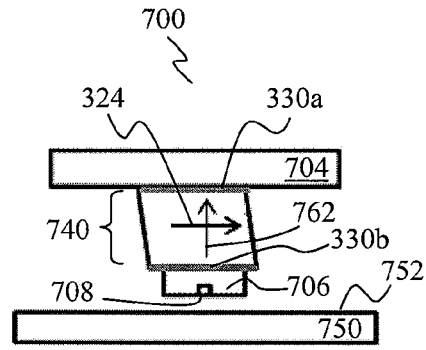

FIGS. 7C to 7E show the working principle of the head gimbal assembly 700 of the embodiment of FIG. 7A, illustrating the working mechanism of the block-shaped piezoelectric shear mode micro-actuator 740, coupled between the tongue portion 704 and the slider 706, for read/write head positioning, relative to the disk platter 750. FIGS. 7C to 7E show respective front views of the head gimbal assembly 700.

FIG. 7C shows the head gimbal assembly 700 including the block-shaped piezoelectric micro-actuator 740 in the initial state or original state where no voltage or electric field is applied to the micro-actuator 740, and therefore no shear deformation of the micro-actuator 740. The coordinates of single crystal axes are also illustrated in FIG. 7C.

When an electric potential is applied to the working electrodes (first electrode 330a and second electrode 330b) of the block-shaped piezoelectric shear mode micro-actuator 740, the micro-actuator 740 undergoes a shear deformation which displaces the slider 706 together with the read/write head 708 in a direction at least substantially perpendicular to the axial direction (longitudinal axis 712, FIGS. 7A and 7B) of the load beam (702, FIGS. 7A and 7B) and at least substantially parallel to the surface 752 of the platter 750. The direction of shear deformation may be controlled by reversing the direction of the electric field applied as shown in FIGS. 7D and 7E.

As shown in FIG. 7D, when a positive voltage is applied to the first electrode 330a and the second electrode 330b, with an electric field direction as represented by the arrow 760, the micro-actuator 740 undergoes deformation under the electric potential such that the slider 706 is displaced in a leftward direction relative to the initial state (as viewed from the front side).

As shown in FIG. 7E, when a negative voltage is applied to the first electrode 330a and the second electrode 330b, with an electric field direction as represented by the arrow 762, the micro-actuator 740 undergoes deformation under the reverse electric potential such that the slider 706 is displaced in a rightward direction relative to the initial state (as viewed from the front side).

Figure 8A:
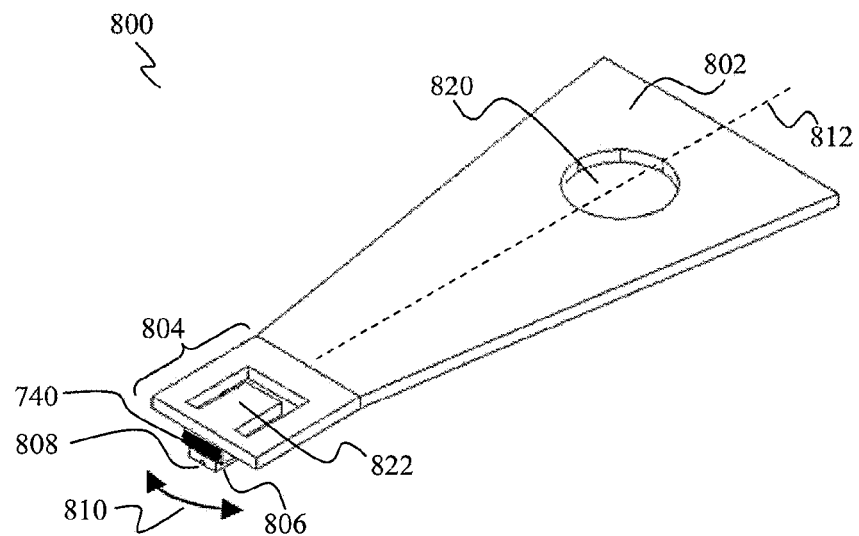
FIG. 8A shows an isometric view of a head gimbal assembly, according to various embodiments.
Figure 8B:
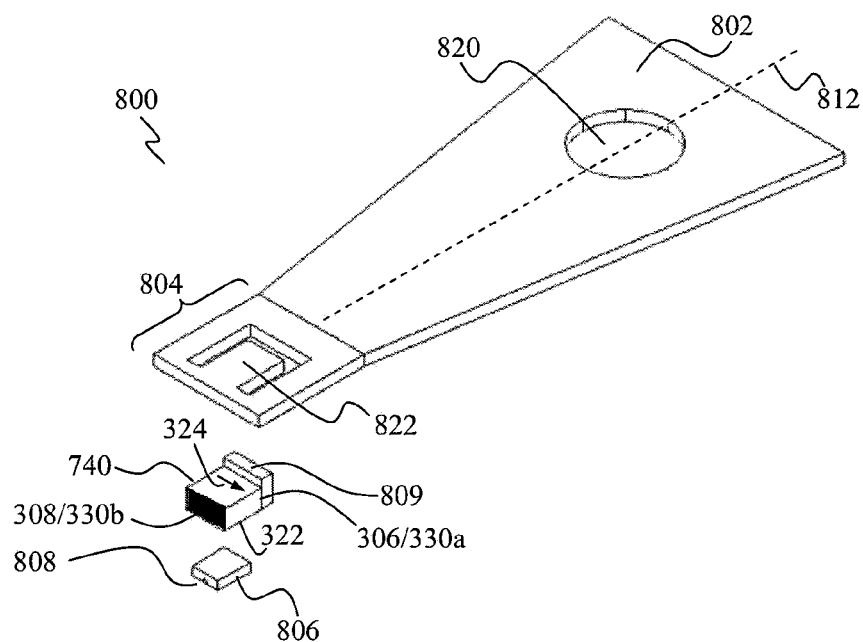
FIG. 8B shows an isometric view of parts of the head gimbal assembly of the embodiment of FIG. 8A, in a disassembled form.

FIG. 8A shows an isometric view of a head gimbal assembly 800, according to various embodiments, while FIG. 8B shows an isometric view of parts of the head gimbal assembly 800, in a disassembled form. The head gimbal assembly 800 may employ a block-shaped piezoelectric actuator or micro-actuator operating in shear mode, which may be similar to that employed in the head gimbal assembly 700, to drive a read/write head directly.

The head gimbal assembly 800, which may be used for a hard disk drive (HDD), may include a load beam 802, a tongue portion 804, a slider 806 including a read/write head 808, a supporting member 809 and a block-shaped piezoelectric single crystal micro-actuator 740. The piezoelectric micro-actuator 740 operates in shear mode under an electric field or voltage applied through or across the two working electrodes (first electrode 330a and second electrode 330b) and the piezoelectric micro-actuator 740 is coupled between the supporting member 809 and the slider 806, with the supporting member 809 coupled to the tongue portion 804, so as to provide displacement to position the slider 806. Thus, the read/write head 808 may move in directions, as represented by the double-headed arrow 810, perpendicular to the axial direction (e.g. longitudinal axis 812) of the load beam 802, and parallel to the surface of a platter (not shown). The piezoelectric micro-actuator 740 has a polarization direction 324 that is at least substantially perpendicular to the longitudinal axis 812.

A hole 820 is defined through the load beam 802, through which a pivot bearing (not shown) may pass through such that the load beam 802 may rotate about the pivot bearing. The tongue portion 804 is positioned or coupled to one end of the load beam 802. The tongue portion 804 may be flexible. The supporting member 809 may be coupled to the tongue portion 804, for example to a flexure portion 822 of the tongue portion 804.

The surface 306, with the first electrode 330a, may be connected to the supporting member 809. The slider 806 may be connected to the surface 322.

The block-shaped piezoelectric micro-actuator 740 may be made of single crystal of PZN-PT, with a composition of $(1-x)Pb(Zn_{1/3}Nb_{2/3})O_3\text{-}xPbTiO_3$ (x=0.06-0.07), and cut in the [111], [1$\bar{1}$0] and [11$\bar{2}$] directions, and poled in the [111] direction corresponding to the PZN-PT single crystal. This means that the PZN-PT single crystal has a polarization direction 324 in the [111] direction. The piezoelectric micro-actuator 740 includes working electrodes (first electrode 330a and second electrode 330b) on the surfaces (surfaces 306, 308) parallel to the (1$\bar{1}$0) plane.

The block-shaped piezoelectric single crystal shear mode micro-actuator 740 may be coupled to the supporting member 809 on a surface (i.e. surface 306) that is at least substantially parallel to the (1$\bar{1}$0) plane. The slider 806 may be coupled to the micro-actuator 740 on a surface (e.g. surface 322) that is at least substantially parallel to the (11$\bar{2}$) plane. The block-shaped piezoelectric single crystal shear mode micro-actuator 740 may position the read/write head 808 in directions at least substantially perpendicular to the axial direction (longitudinal axis 812, FIGS. 8A and 8B) of the load beam (802, FIGS. 8A and 8B) and at least substantially parallel to the surface of the platter (not shown).

Figure 8C:
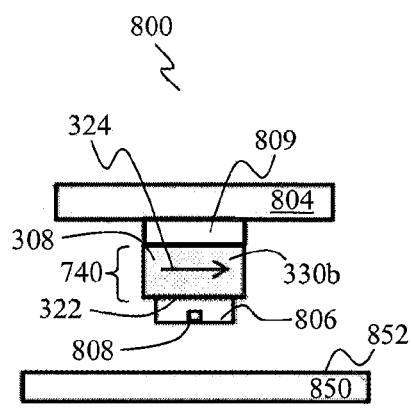
FIGS. 8C to 8E show the working principle of the head gimbal assembly of the embodiment of FIG. 8A.
Figure 8C:
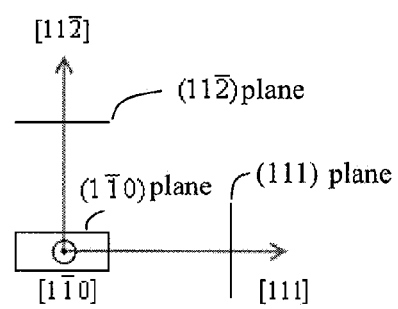
Figure 8D:
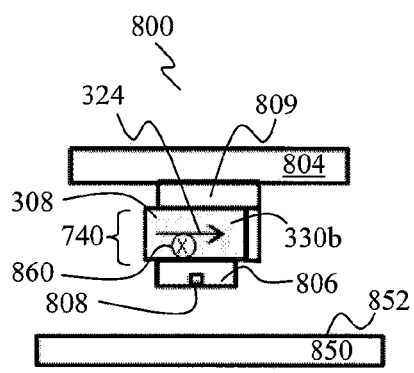
Figure 8E:
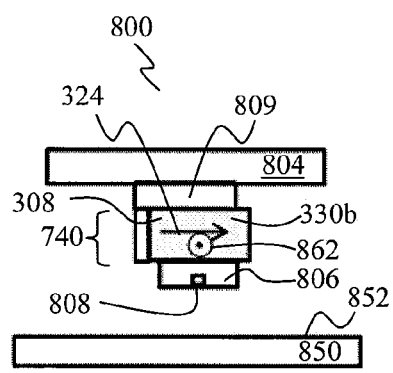

FIGS. 8C to 8E show the working principle of the head gimbal assembly 800 of the embodiment of FIG. 8A, illustrating the working mechanism of the block-shaped piezoelectric shear mode micro-actuator 740, coupled between the slider 806 and the supporting member 809, which in turn is coupled to the tongue portion 804, for read/write head positioning, relative to the disk platter 850. FIGS. 8C to 8E show respective front views of the head gimbal assembly 800.

FIG. 8C shows the head gimbal assembly 800 including the block-shaped piezoelectric micro-actuator 740 in the initial state or original state where no voltage or electric field is applied to the micro-actuator 740, and therefore no shear deformation of the micro-actuator 740. The coordinates of single crystal axes are also illustrated in FIG. 8C.

When an electric potential is applied to the working electrodes (first electrode 330a and second electrode 330b) of the block-shaped piezoelectric shear mode micro-actuator 740, the micro-actuator 740 undergoes a shear deformation which displaces the slider 806 together with the read/write head 808, so as to position the read/write head 808 in directions at least substantially perpendicular to the axial direction (longitudinal axis 812, FIGS. 8A and 8B) of the load beam (802, FIGS. 8A and 8B) and at least substantially parallel to the surface 852 of the platter 850. The direction of shear deformation or displacement may be controlled by reversing the direction of the electric field applied as shown in FIGS. 8D and 8E.

As shown in FIG. 8D, when a positive voltage is applied to the first electrode 330a and the second electrode 330b, with an electric field direction as represented by the circle 860 with a cross therewithin to denote an inward direction into the page, the micro-actuator 740 undergoes deformation under the electric potential such that the slider 806 is displaced in a leftward direction relative to the initial state (as viewed from the front side).

As shown in FIG. 8E, when a negative voltage is applied to the first electrode 330a and the second electrode 330b, with an electric field direction as represented by the circle 862 with a dot therewithin to denote an outward direction out of the page, the micro-actuator 740 undergoes deformation, in a reverse direction, under the reverse electric potential such that the slider 806 is displaced in a rightward direction relative to the initial state (as viewed from the front side).

In the context of various embodiments of the piezoelectric actuators 300, 350, 450, 740, the piezoelectric single crystals that may be used include but not limited to $(1-x)Pb(Zn_{1/3}Nb_{2/3})O_3\text{-}xPbTiO_3$ where x=0.04 to 0.09, $(1-x)Pb(Mg_{1/3}Nb_{2/3})O_3\text{-}xPbTiO_3$ where x=0.25 to 0.35, $(1-x-y)Pb(In_{1/2}Nb_{1/2})O_3\text{-}yPb(Mg_{1/3}Nb_{2/3})O_3\text{-}xPbTiO_3$ where x=0.25 to 0.35 and y=0.3-0.35, $(1-x)Pb(Yb_{1/2}Nb_{1/2})O_3\text{-}xPbTiO_3$, where x=0.45 to 0.55 and their solid state solution. These piezoelectric single crystals are ferroelectric relaxor materials with a perovskite structure. These piezoelectric single crystals may be cut in the [111], [1$\bar{1}$0] and [11$\bar{2}$] directions with a poling direction in the [111] direction. The working electrodes may be formed or deposited on surfaces parallel to the (1$\bar{1}$0) or the (11$\bar{2}$) plane, and, for L-shaped actuators, also on the inward elbow surfaces. It should be appreciated that piezoelectric ceramics and polymers may also be used to form the piezoelectric actuators of various embodiments for the shear mode operation.

Several block-shaped piezoelectric single crystal shear mode micro-actuators for hard disk drive applications were fabricated and tested. The fabrication process for forming a block-shaped piezoelectric shear mode micro-actuator and the related results and numerical simulations will now be described with reference to the following non-limiting examples.

Figure 9:
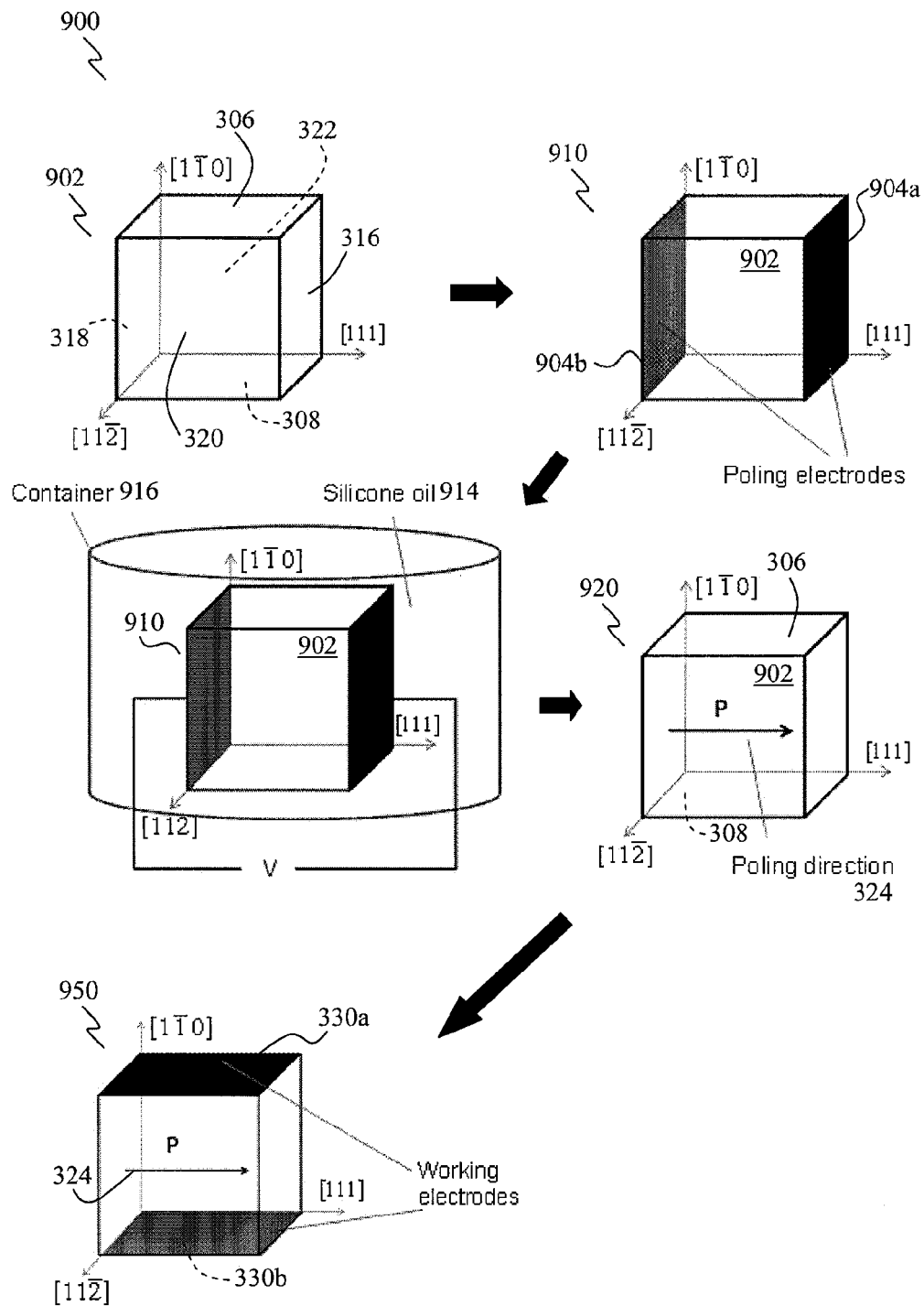
FIG. 9 shows a fabrication process for forming a block-shaped piezoelectric actuator, according to various embodiments.

FIG. 9 shows a fabrication process 900 for forming a block-shaped piezoelectric actuator, according to various embodiments. The fabrication process 900 may form a block-shaped piezoelectric single crystal shear mode micro-actuator, which may be used for positioning a read/write head in a hard disk drive.

Using a $(1-x)Pb(Zn_{1/3}Nb_{2/3})O_3\text{-}xPbTiO_3$ (x=0.06-0.07) single crystal as a non-limiting example, the $(1-x)Pb(Zn_{1/3}Nb_{2/3})O_3\text{-}xPbTiO_3$ (x=0.06-0.07) single crystal may be cut in the [111], [1$\bar{1}$0] and [11$\bar{2}$] directions, with dimensions of about 1 mm in the [111] direction, about 1 mm in the [1$\bar{1}$0] direction and about 0.5 mm in the [11$\bar{2}$] direction. This may form a block-shaped piezoelectric material 902 with a top surface 306 and a bottom surface 208, each of which is at least substantially parallel to a (1$\bar{1}$0) plane of the piezoelectric material 902, a first end surface 316 and a second end surface 318, each of which is at least substantially parallel to a (111) plane of the piezoelectric material 902, and a first sidewise surface 320 and a second sidewise surface 322, each of which is at least substantially parallel to a (11$\bar{2}$) plane of the piezoelectric material 902.

Gold (Au) poling electrodes, in the form of a first poling electrode 904a and a second poling electrode 904b, each of about 200 nm in thickness, may be deposited by sputtering on the surfaces parallel to the (111) plane. Therefore, a structure 910 having the piezoelectric material 902, with the first poling electrode 904a and the second poling electrode 904b deposited respectively on the first end surface 316 and the second end surface 318 may be obtained.

The $(1-x)Pb(Zn_{1/3}Nb_{2/3})O_3\text{-}xPTiO_3$ (x=0.06-0.07) single crystal, of the structure 910, may be subsequently poled in the [111] direction at room temperature in silicone oil 914, with a poling electric field of about 1 kV/mm applied through the first poling electrode 904a and the second poling electrode 904b, with the application of a voltage, V. The structure 910 may be placed in a container 916 containing the silicone oil 914.

After poling, the polarization of the piezoelectric material 902 is aligned in the [111] direction. The poling electrodes (the first poling electrode 904a and the second poling electrode 904b) on the (111) surface planes (the first end surface 316 and the second end surface 318) may be removed by gold etching. A structure 920, having the piezoelectric material 902 with a polarization direction 324 aligned in the [111] direction, may be obtained.

Gold (Au) working electrodes with a thickness of about 200 nm may subsequently be sputtered on the top surface 306 and the bottom surface 308 parallel to the ($1\bar{1}0$) plane of the $(1-x)Pb(Zn_{1/3}Nb_{2/3})O_3$-$xPbTiO_3$ (x=0.06-0.07) single crystal. Therefore, a structure 950 having the block-shaped piezoelectric material 920, with a first working electrode 330a deposited on the surface 306 and a second working electrode 330b deposited on the surface 308 may be obtained.

Figure 10:
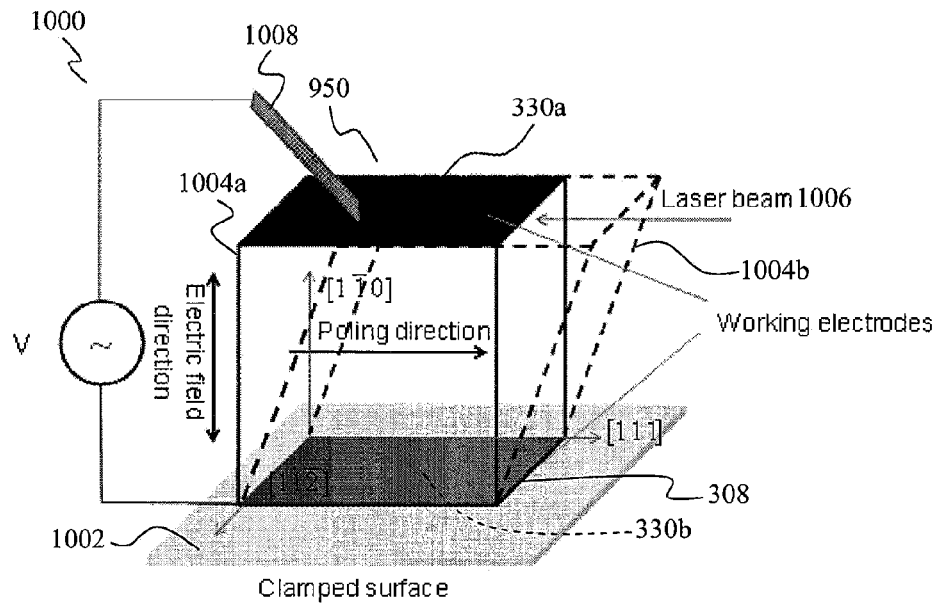
FIG. 10 shows a set-up for shear displacement and resonance measurement of a block-shaped piezoelectric single crystal shear mode micro-actuator, according to various embodiments.

FIG. 10 shows a set-up 1000 for shear displacement and resonance measurement of a block-shaped piezoelectric single crystal shear mode micro-actuator 950, according to various embodiments, using a laser scanning vibrometer (LSV). The block-shaped piezoelectric single crystal shear mode micro-actuator 950 may be bonded on a fixture (e.g. clamped to a surface 1002) on an electrode surface (e.g. surface 308) which is parallel to the ($1\bar{1}0$) plane. An electric potential, V, may be applied between the top electrode 330a and the bottom electrode 330b, resulting in shear deformation of the block-shaped piezoelectric single crystal shear mode micro-actuator 950. An electrical connection 1008, for example in the form of an electrical wire or a probe, may be provided to the top electrode 330a. As a non-limiting example, depending on the direction of the electric field, the block-shaped piezoelectric single crystal shear mode micro-actuator 950 may undergo a shear deformation from its initial state as represented by the solid line box 1004a to a displaced state as represented by the dashed line box 1004b. A laser beam 1006 may be spotted on a surface parallel to the (111) plane, through which the shear displacement and frequency response of the block-shaped piezoelectric single crystal shear mode micro-actuator 950 may be measured with a laser scanning vibrometer (LSV) (not shown).

Figure 11:
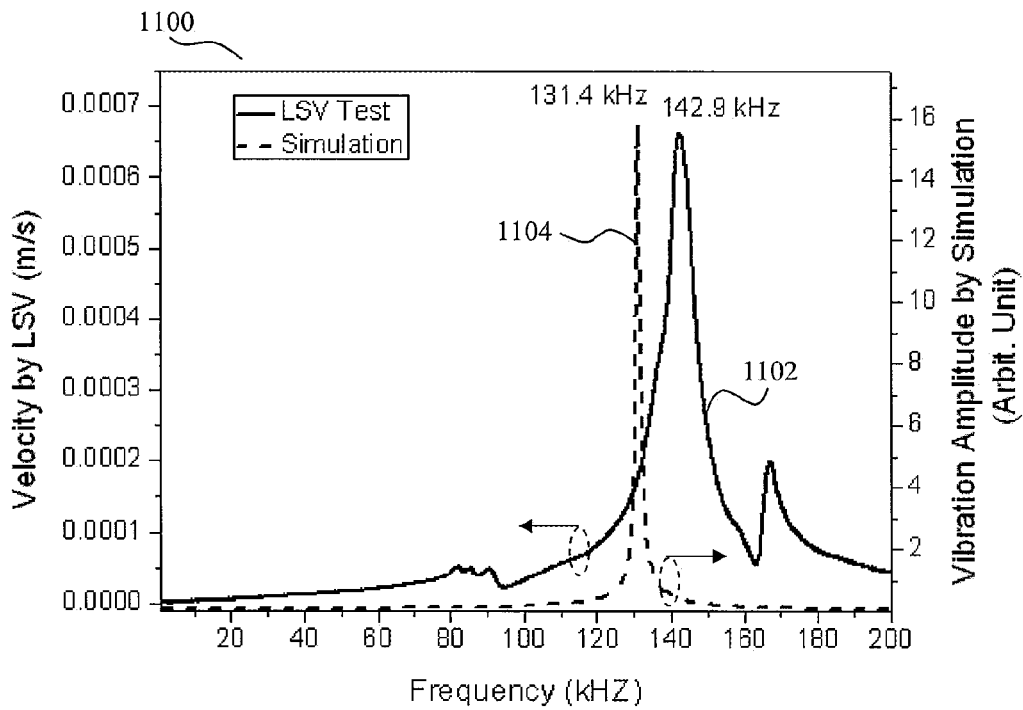
FIG. 11 shows a plot of the resonant response of a block-shaped piezoelectric single crystal shear mode micro-actuator, based on laser scanning vibrometer (LSV) and the corresponding numerical simulation result.

FIG. 11 shows a plot 1100 of the resonant response of the block-shaped piezoelectric single crystal shear mode micro-actuator based on laser scanning vibrometer (LSV) and the corresponding numerical simulation result, for comparison of the LSV measurement result 1102 and the simulation result 1104 for the resonant frequencies of the block-shaped piezoelectric single crystal micro-actuator 950 (FIG. 10) having a $(1-x)Pb(Zn_{1/3}Nb_{2/3})O_3$-$xPbTiO_3$ (x=0.06-0.07) single crystal.

It may be observed from plot 1100 that the first resonant frequency of the $(1-x)Pb(Zn_{1/3}Nb_{2/3})O_3$-$xPbTiO_3$ (x=0.06-0.07) single crystal in the LSV measurement, based on the result 1102, is found to be about 81.6 kHz. However, by comparing the LSV measurement result 1102 with the simulation result 1104 where the simulated first resonance is 131.4 kHz, it may be seen that the intrinsic first resonant frequency of the block-shaped piezoelectric single crystal shear mode micro-actuator 950 should be 142.9 kHz. Thus, the intrinsic first resonant frequency of the sample, in the form of a $(1-x)Pb(Zn_{1/3}Nb_{2/3})O_3$-$xPbTiO_3$ (x=0.06-0.07) single crystal, is the resonant frequency in the results 1102 in the LSV test, which is approximately 142.9 kHz. The 142.9 kHz resonance, being the intrinsic shear mode resonance of the micro-actuator 950 observed in the LSV test, is the resonant frequency defining the intrinsic bandwith of the actuator 950. The resonances at frequencies around 81.6 kHz may be due to undesired mechanical clamping in the measurement test.

When a block-shaped piezoelectric single crystal shear mode micro-actuator (e.g. 740, FIGS. 7C to 7E; 950, FIG. 9) is attached to a slider, for example similar to that as shown in the configuration of FIGS. 7C to 7E, the resonant frequency may be reduced due to the mass effect of the slider (e.g. 706, FIGS. 7C to 7E).

Figure 12:
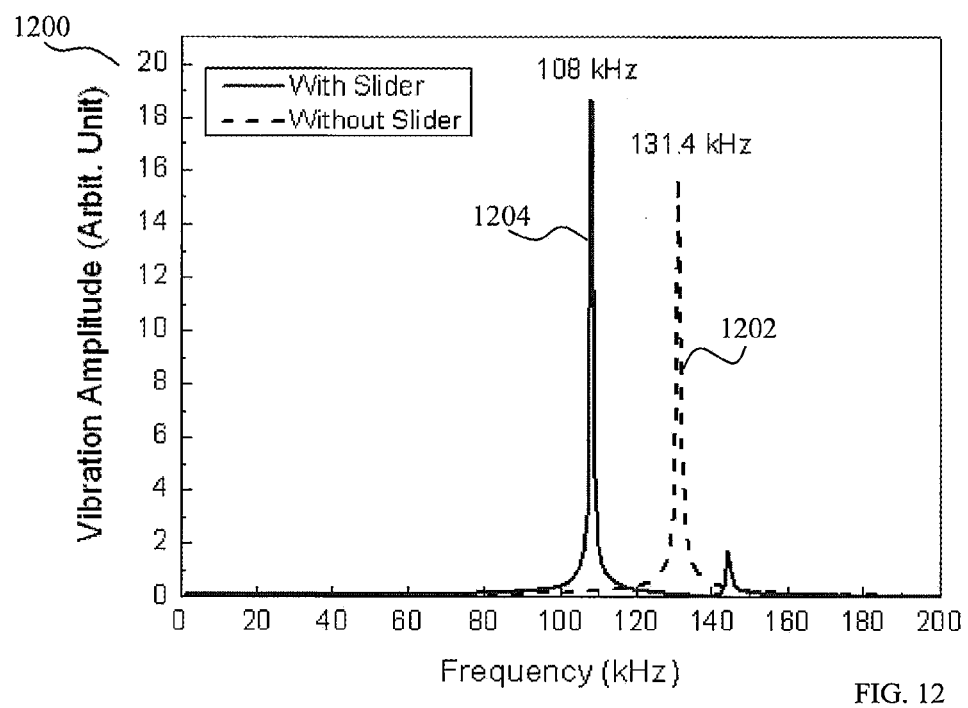
FIG. 12 shows a plot of simulation results of the resonant response of a block-shaped piezoelectric single crystal shear mode micro-actuator, with or without a slider.

FIG. 12 shows a plot 1200 of simulation results of the resonant response of a block-shaped piezoelectric single crystal shear mode micro-actuator (e.g. 740, FIGS. 7C to 7E; 950, FIG. 9), with or without a slider. The plot 1200 shows the result 1202 for the resonant response of the block-shaped piezoelectric single crystal shear mode micro-actuator without a slider, and the result 1204 for the resonant response of the block-shaped piezoelectric single crystal shear mode micro-actuator attached with a Femto slider whose dimensions are approximately 0.85 mm in length, approximately 0.70 mm in width and approximately 0.23 mm in height. The mass of the Femto slider is about 0.60 mg.

From plot 1200, it may be observed that the first simulated resonant frequency is reduced from about 131.4 kHz, without a slider, to about 108 kHz, when attached to the slider. The bandwidth of about 108 kHz of the block-shaped piezoelectric single crystal shear mode micro-actuator with the slider is much higher than that of typical hard drive actuators which are usually below 30~50 kHz.

Figure 13:
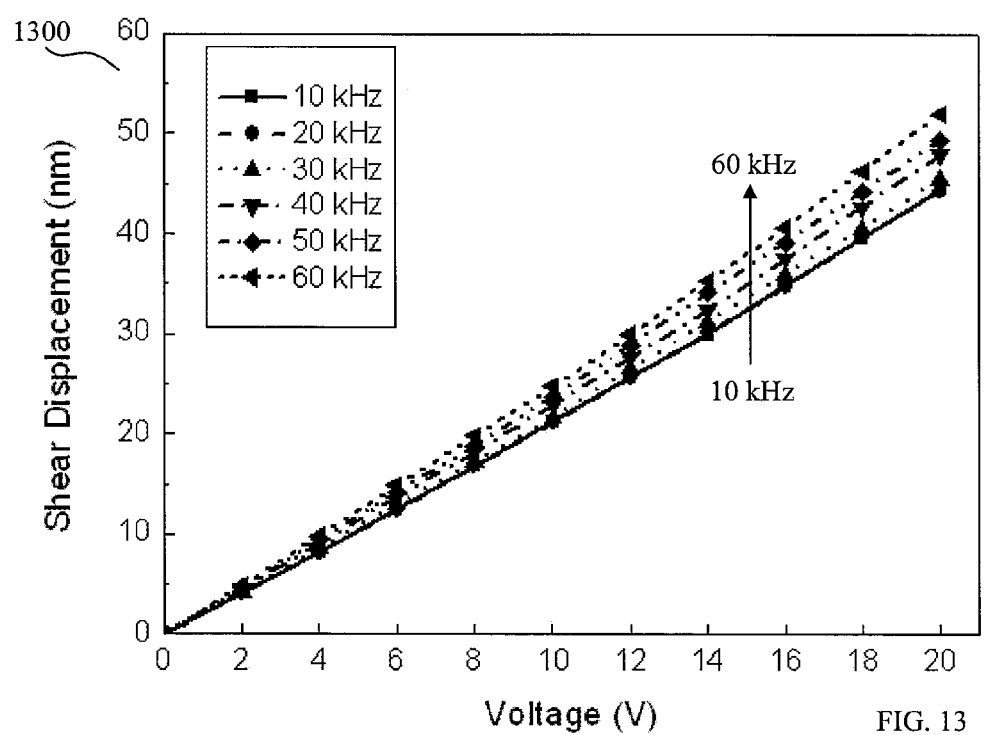
FIG. 13 shows a plot illustrating the relationship between the shear displacement and the applied electric potential for a block-shaped piezoelectric shear mode micro-actuator at different frequencies, according to various embodiments.

FIG. 13 shows a plot 1300 illustrating the relationship between the shear displacement and the applied electric potential for a block-shaped piezoelectric shear mode micro-actuator at different frequencies, according to various embodiments. Plot 1300 shows the results in the frequency range of between about 10 kHz to about 60 kHz. It may be observed that the shear displacement is in linear relationship with the applied electric potential for frequencies ranging from 10 to 60 kHz. It may also be observed that the shear displacements at about 12 V are within the range of about 25.4 nm to about 30.7 nm for frequencies ranging from 10 to 60 kHz.

The bandwidth and the shear displacement of the block-shaped piezoelectric single crystal shear mode micro-actuator at 12 V may be enough to meet the requirements of high density hard disk drives.

Figure 14:
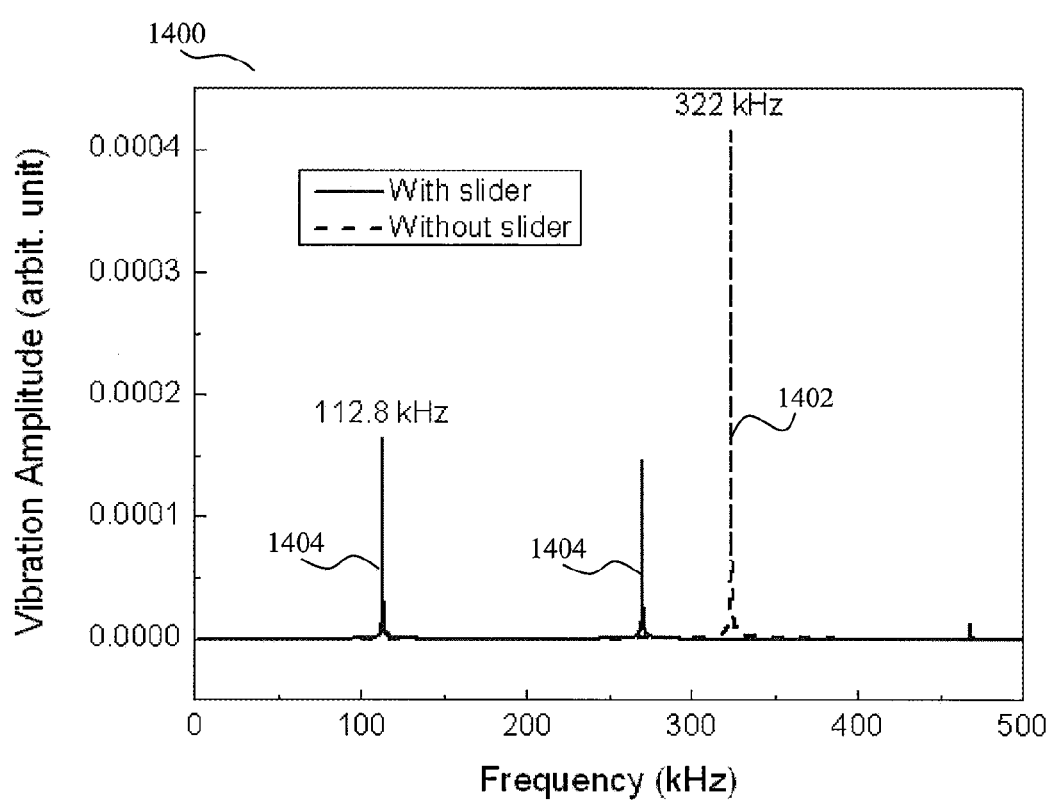
FIG. 14 shows a plot of analysis results of the resonant frequency of an L-shaped piezoelectric single crystal shear mode micro-actuator, with and without a slider.

FIG. 14 shows a plot 1400 of analysis (simulation) results of the resonant frequency of an L-shaped piezoelectric single crystal shear mode micro-actuator, with and without a slider. The L-shaped piezoelectric single crystal shear mode micro-actuator may be attached to a slider, for example similar to that as shown in the configuration of FIGS. 5C to 5E. The L-shaped piezoelectric single crystal shear mode micro-actuator may be similar to the L-shaped piezoelectric actuator 350 of FIGS. 3C and 3D. Accordingly, FIG. 14 shows the simulated bandwidth of an L-shaped piezoelectric shear mode micro-actuator of $(1-x)Pb(Zn_{1/3}Nb_{2/3})O_3$-$xPbTiO_3$ (x=0.06-0.07) single crystal, with dimensions of about 1 mm in the [111] direction, about 0.5 mm in the [$1\bar{1}0$] direction and about 0.3 mm in the [112] direction, and $\theta_1$ 110.6°, $\theta_2$=113.5° and $\theta_3$=92.96°.

Plot 1400 shows the result 1402 for the resonant response of the L-shaped piezoelectric single crystal shear mode micro-actuator without a slider, and the result 1404 for the resonant response of the L-shaped piezoelectric single crystal shear mode micro-actuator attached with a Femto slider whose dimensions are approximately 0.85 mm in length, approximately 0.70 mm in width and approximately 0.23 mm in height. The mass of the Femto slider is about 0.60 mg.

From plot 1400, it may be observed that the resonant frequency for the L-shaped piezoelectric shear mode micro-actuator is about 322 kHz, without any slider, and is about 112.8 kHz for the micro-actuator with the Femto slider.

The shear displacement under a 12 V electric potential is about 121 nm, which is approximately 68% larger than that of a block-shaped piezoelectric shear mode micro-actuator with a similar size. The high frequency bandwidth and large displacement associated with the L-shaped piezoelectric shear mode micro-actuator may meet the stringent requirements of nano-positioning of the magnetic head in high density hard disk drives.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A piezoelectric actuator comprising:
   a shear mode piezoelectric material comprising a first arm and a second arm intersecting each other, the shear mode piezoelectric material having a polarization direction oriented at least substantially along a length of the first arm,
   wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

2. The piezoelectric actuator as claimed in claim 1, wherein the first arm has a first length and the second arm has a second length, wherein the first length is longer than the second length.

3. The piezoelectric actuator as claimed in claim 1, further comprising a first electrode on the first surface and a second electrode on the second surface.

4. The piezoelectric actuator as claimed in claim 1,
   wherein the first surface is defined by a first side surface of the first arm on a first side of the first arm,
   wherein the second arm intersects the first arm on a second side of the first arm, the first side and the second side being opposite sides, and
   wherein the second surface is defined by a second side surface of the first arm on the second side and two adjacent second side surfaces of the second arm on the second side.

5. The piezoelectric actuator as claimed in claim 1, wherein the first arm and the second arm intersect each other at least substantially orthogonally.

6. The piezoelectric actuator as claimed in claim 5, wherein an end of the first arm and an end of the second arm intersect each other, thereby forming an at least substantially L-shaped shear mode piezoelectric material.

7. The piezoelectric actuator as claimed in claim 6,
   wherein between the two adjacent second side surfaces of the second arm, a first interior angle is provided,
   wherein between the second side surface of the first arm and one second side surface of the two adjacent second side surfaces of the second arm on the second side adjoining the second side surface of the first arm, a second interior angle is provided,
   wherein between the second side surface of the first arm and a surface of the first arm which the axis at least substantially parallel to the polarization direction intersects, a third interior angle is provided, and
   wherein each of the first interior angle, the third interior angle, and a conjugate angle of the second interior angle is between about 90° and about 120°.

8. The piezoelectric actuator as claimed in claim 7, wherein each of the first interior angle, the conjugate angle and the third interior angle is about 90°.

9. The piezoelectric actuator as claimed in claim 7, wherein the first interior angle is about 110.6°, the conjugate angle is about 113.5° and the third interior angle is about 92.96°.

10. The piezoelectric actuator as claimed in claim 1,
    wherein the first surface and at least a portion of the second surface are arranged at least substantially parallel to a (1$\overline{1}$0) plane or a (11$\overline{2}$) plane of the shear mode piezoelectric material, and
    wherein the polarization direction is at least substantially perpendicular to a (111) plane of the shear mode piezoelectric material.

11. The piezoelectric actuator as claimed in claim 1, wherein the shear mode piezoelectric material comprises at least one of a piezoelectric ceramic, a piezoelectric single crystal or a piezoelectric polymer.

12. The piezoelectric actuator as claimed in claim 1, wherein the shear mode piezoelectric material is made of a ferroelectric relaxor single crystal material with a perovskite structure.

13. The piezoelectric actuator as claimed in claim 12, wherein the ferroelectric relaxor single crystal material with the perovskite structure is selected from the group consisting of $(1-x)Pb(Zn_{1/3}Nb_{2/3})O_3$-$xPbTiO_3$ where x=0.04 to 0.09, $(1-x)Pb(Mg_{1/3}Nb_{2/3})O_3$-$xPbTiO_3$ where x=0.25 to 0.35, $(1-x-y)Pb(In_{1/2}Nb_{1/2})O_3$-$yPb(Mg_{1/3}Nb_{2/3})O_3$-$xPbTiO_3$ where x=0.25 to 0.35 and y=0.3 to 0.35, $(1-x)Pb(Yb_{1/2}Nb_{1/2})O_3$-$xPbTiO_3$, where x=0.45 to 0.55, or their solid state solutions.

14. The piezoelectric actuator as claimed in claim 12, wherein the ferroelectric relaxor single crystal material with the perovskite structure is cut in a [111] direction, a [1$\overline{1}$0] direction and a [11$\overline{2}$] direction of the ferroelectric relaxor single crystal material,
    wherein the polarization direction oriented at least substantially along the length of the first arm is aligned at least substantially in the [111] direction, and
    wherein the first surface and at least a portion of the second surface are arranged aligned at least substantially in the [1$\overline{1}$0] direction or the [11$\overline{2}$] direction such that the electric field is applied in the [1$\overline{1}$0] direction or the [11$\overline{2}$] direction that is oriented at least substantially perpendicular to the polarization direction.

15. A method of forming a piezoelectric actuator, the method comprising:
    poling a shear mode piezoelectric material to provide a polarization direction; and
    forming the shear mode piezoelectric material into a first arm and a second arm intersecting each other,
    wherein the polarization direction is oriented at least substantially along a length of the first arm, and
    wherein the shear mode piezoelectric material has a first surface and a second surface opposite to the first surface, the first surface and the second surface being adapted to undergo a shear displacement relative to each other along an axis at least substantially parallel to the polarization direction in response to an electric field applied between the first surface and the second surface in a direction at least substantially perpendicular to the polarization direction.

16. A head gimbal assembly for a disk drive, the head gimbal assembly comprising:
 a load beam comprising a tongue portion at an end thereof;
 a slider comprising a read/write head; and
 a shear mode piezoelectric material coupled between the tongue portion and the slider,
 wherein the shear mode piezoelectric material comprises a first arm and a second arm intersecting each other,
 wherein the shear mode piezoelectric material has a polarization direction oriented at least substantially along a length of the first arm, and
 wherein the shear mode piezoelectric material has a first surface and a second surface opposite to the first surface, the first surface and the second surface being adapted to undergo a shear displacement relative to each other for displacing the read/write head along an axis at least substantially parallel to the polarization direction in response to an electric field applied between the first surface and the second surface in a direction at least substantially perpendicular to the polarization direction.

17. The head gimbal assembly as claimed in claim 16, wherein the load beam defines a longitudinal axis, and wherein the polarization direction is oriented at least substantially perpendicular to the longitudinal axis.

18. The head gimbal assembly as claimed in claim 16, wherein the first surface is defined by a first side surface of the first arm on a first side of the first arm, wherein the second arm intersects the first arm on a second side of the first arm, the first side and the second side being opposite sides, and wherein the first surface is connected to the tongue portion.

19. The head gimbal assembly as claimed in claim 16, wherein the first arm and the second arm intersect each other at least substantially orthogonally, and wherein an end of the first arm and an end of the second arm intersect each other, thereby forming an at least substantially L-shaped shear mode piezoelectric material.

20. The head gimbal assembly as claimed in claim 16, wherein the first surface and at least a portion of the second surface are arranged at least substantially parallel to a ($1\bar{1}0$) plane or a ($11\bar{2}$) plane of the shear mode piezoelectric material, and wherein the polarization direction is at least substantially perpendicular to a (111) plane of the shear mode piezoelectric material.

21. The head gimbal assembly as claimed in claim 16, further comprising a supporting member for coupling the shear mode piezoelectric material to the tongue portion,
 wherein the first surface is defined by a first side surface of the first arm on a first side of the first arm,
 wherein the second arm intersects the first arm on a second side of the first arm, the first side and the second side being opposite sides,
 wherein the first surface is connected to a surface of the supporting member, and
 wherein an other surface of the supporting member is connected to the tongue portion, the other surface of the supporting member being at least substantially perpendicular to the surface of the supporting member.

22. The head gimbal assembly as claimed in claim 21, wherein the first surface and at least a portion of the second surface are arranged at least substantially parallel to a ($1\bar{1}0$) plane or a ($11\bar{2}$) plane of the shear mode piezoelectric material, wherein the polarization direction is at least substantially perpendicular to a (111) plane of the shear mode piezoelectric material, and wherein the read/write head is connected to a surface of the shear mode piezoelectric material that is at least substantially parallel to a ($11\bar{2}$) plane or a ($1\bar{1}0$) plane of the shear mode piezoelectric material.

23. A head gimbal assembly for a disk drive, the head gimbal assembly comprising:
 a load beam comprising a tongue portion at an end thereof, the load beam defining a longitudinal axis;
 a slider comprising a read/write head; and
 a shear mode piezoelectric single crystal material coupled between the tongue portion and the slider,
 wherein the shear mode piezoelectric single crystal material has a polarization direction oriented at least substantially perpendicular to the longitudinal axis,
 wherein the shear mode piezoelectric single crystal material has a first surface and a second surface opposite to the first surface, the first surface and the second surface being adapted to undergo a shear displacement relative to each other for displacing the read/write head along an axis at least substantially parallel to the polarization direction in response to an electric field applied between the first surface and the second surface in a direction at least substantially perpendicular to the polarization direction,
 wherein the first surface and the second surface are arranged at least substantially parallel to a ($1\bar{1}0$) plane or a ($11\bar{2}$) plane of the shear mode piezoelectric single crystal material,
 wherein the polarization direction is at least substantially perpendicular to a (111) plane of the shear mode piezoelectric single crystal material, and
 wherein the first surface is coupled to the tongue portion.

24. The head gimbal assembly as claimed in claim 23, further comprising a supporting member for coupling the shear mode piezoelectric single crystal material to the tongue portion,
 wherein the first surface and the second surface are arranged at least substantially parallel to a plane which intersects the longitudinal axis,
 wherein the first surface of the shear mode piezoelectric single crystal is connected to a surface of the supporting member,
 wherein an other surface of the supporting member is connected to the tongue portion, the other surface of the supporting member being at least substantially perpendicular to the surface of the supporting member and
 wherein the read/write head is connected to a surface of the shear mode piezoelectric single crystal material extending between the first surface and the second surface.

\* \* \* \* \*

UNITED STATES PATENT AND TRADEMARK OFFICE
CERTIFICATE OF CORRECTION

| | | |
|---|---|---|
| PATENT NO. | : 8,767,355 B2 | Page 1 of 1 |
| APPLICATION NO. | : 13/746961 | |
| DATED | : July 1, 2014 | |
| INVENTOR(S) | : Lei Zhang et al. | |

It is certified that error appears in the above-identified patent and that said Letters Patent is hereby corrected as shown below:

ON THE TITLE PAGE:

(30) should read        Foreign Application Priority Data

Jan. 19, 2012  (SG)  ......................................................201200432-1

Signed and Sealed this
Twenty-fifth Day of November, 2014

Michelle K. Lee
*Deputy Director of the United States Patent and Trademark Office*